US012543420B2

(12) United States Patent
Moriyama et al.

(10) Patent No.: US 12,543,420 B2
(45) Date of Patent: Feb. 3, 2026

(54) LIGHT-EMITTING DEVICE AND DISPLAY APPARATUS

(71) Applicant: SONY SEMICONDUCTOR SOLUTIONS CORPORATION, Kanagawa (JP)

(72) Inventors: Jyo Moriyama, Nagasaki (JP); Hiroyuki Kashihara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 447 days.

(21) Appl. No.: 18/004,763

(22) PCT Filed: Jun. 10, 2021

(86) PCT No.: PCT/JP2021/022193
§ 371 (c)(1),
(2) Date: Jan. 9, 2023

(87) PCT Pub. No.: WO2022/014216
PCT Pub. Date: Jan. 20, 2022

(65) Prior Publication Data
US 2023/0261158 A1     Aug. 17, 2023

(30) Foreign Application Priority Data

Jul. 17, 2020   (JP) ................ 2020-123308

(51) Int. Cl.
*H10H 20/857*     (2025.01)
*H01L 25/075*     (2006.01)
(Continued)

(52) U.S. Cl.
CPC ....... *H10H 20/857* (2025.01); *H01L 25/0753* (2013.01); *H10H 20/818* (2025.01);
(Continued)

(58) Field of Classification Search
CPC .............. H10H 20/857; H10H 20/818; H10H 20/8312; H10H 20/8514; H10H 29/142; H01L 25/0753
See application file for complete search history.

(56) References Cited

U.S. PATENT DOCUMENTS 9,287,446 B2 * 3/2016 Yoo ................. B82Y 20/00
2006/0163591 A1 * 7/2006 Diekmann ........... H10K 59/38
257/89

(Continued)

FOREIGN PATENT DOCUMENTS

| CN | 109962060 A | 7/2019 |
|---|---|---|
| JP | 2019-054127 | 4/2019 |
| WO | WO 2020/100407 | 5/2020 |

OTHER PUBLICATIONS

International Search Report and Written Opinion prepared by the Japan Patent Office on Aug. 11, 2021, for International Application No. PCT/JP2021/022193, 2 pgs.

*Primary Examiner* — Eugene Lee
(74) *Attorney, Agent, or Firm* — Sheridan Ross PC

(57) ABSTRACT

A light-emitting device of an embodiment of the present disclosure includes: an insulating layer having a first surface and a second surface that are opposed to each other; multiple columnar structures each including a columnar crystalline structure of a first electrically-conductive type erected in a direction perpendicular to the first surface of the insulating layer, and an active layer and a semiconductor layer of a second electrically-conductive type that are stacked in this order on a side surface and a top surface of the columnar crystalline structure; and a light-blocking member provided between the multiple columnar structures and having an inclined surface of less than 90° relative to the first surface.

20 Claims, 31 Drawing Sheets

(51) Int. Cl.
*H10H 20/818* (2025.01)
*H10H 20/831* (2025.01)
*H10H 20/851* (2025.01)
*H10H 29/14* (2025.01)

(52) U.S. Cl.
CPC .... *H10H 20/8312* (2025.01); *H10H 20/8514* (2025.01); *H10H 29/142* (2025.01)

(56) References Cited

U.S. PATENT DOCUMENTS

| | | | |
|---|---|---|---|
| 2013/0140521 A1* | 6/2013 | Gilet | H10H 20/811 257/13 |
| 2014/0166974 A1* | 6/2014 | Yoo | H10H 20/813 257/13 |
| 2014/0209859 A1 | 7/2014 | Cha | |
| 2015/0221823 A1* | 8/2015 | Hwang | G02B 6/0073 362/97.1 |
| 2017/0323925 A1* | 11/2017 | Schneider, Jr. | H10H 20/0137 |
| 2017/0358719 A1* | 12/2017 | Scholz | H10H 20/8514 |
| 2017/0365751 A1* | 12/2017 | Butendeich | H10H 20/851 |
| 2018/0287030 A1* | 10/2018 | Takeya | H10D 86/441 |
| 2019/0058080 A1 | 2/2019 | Ahmed | |
| 2019/0221731 A1* | 7/2019 | Konsek | H10H 20/821 |
| 2019/0363069 A1 | 11/2019 | Ahmed et al. | |
| 2020/0343420 A1* | 10/2020 | Avramescu | H10H 20/851 |
| 2020/0388723 A1* | 12/2020 | Ahmed | H10H 20/833 |

\* cited by examiner

LIGHT-EMITTING DEVICE AND DISPLAY APPARATUS

CROSS REFERENCE TO RELATED APPLICATIONS

This application is a national stage application under 35 U.S.C. 371 and claims the benefit of PCT Application No. PCT/JP2021/022193, having an international filing date of 10 Jun. 2021, which designated the United States, which PCT application claimed the benefit of Japanese Patent Application No. 2020-123308, filed 17 Jul. 2020, the entire disclosures of each of which are incorporated herein by reference.

TECHNICAL FIELD

The present disclosure relates to, for example, a light-emitting device including multiple light-emitting sections and a display apparatus including the light-emitting device.

BACKGROUND ART

For example, PTL 1 discloses a light-emitting device in which an optical confinement factor is increased by providing a light propagation layer and providing thereabove and therebelow low-refractive-index parts each having a refractive index lower than that of the light propagation layer, between multiple columnar parts in which a first semiconductor layer, an active layer, and a second semiconductor layer are stacked in this order.

CITATION LIST

Patent Literature

PTL 1: Japanese Unexamined Patent Application Publication No. 2019-054127

SUMMARY OF THE INVENTION

Incidentally, a light-emitting device including multiple light-emitting sections each including a light-emitting diode (LED) is required to suppress color mixture between adjacent light-emitting sections.

It is desirable to provide a light-emitting device that makes it possible to suppress occurrence of color mixture and a display apparatus including the light-emitting device.

A light-emitting device of an embodiment of the present disclosure includes: an insulating layer having a first surface and a second surface that are opposed to each other; multiple columnar structures each including a columnar crystalline structure of a first electrically-conductive type erected in a direction perpendicular to the first surface of the insulating layer, and an active layer and a semiconductor layer of a second electrically-conductive type that are stacked in this order on a side surface and a top surface of the columnar crystalline structure; and a light-blocking member provided between the multiple columnar structures and having an inclined surface of less than 90° relative to the first surface.

A display apparatus of an embodiment of the present disclosure includes the light-emitting device of the embodiment as one or multiple light-emitting devices.

In the light-emitting device of an embodiment of the present disclosure and the display apparatus of an embodiment of the present disclosure, the light-blocking member having an inclined surface of less than 90° relative to the first surface is provided between the multiple columnar structures erected on the first surface of the insulating layer having the first surface and the second surface opposed to each other. This allows for suppression of optical leakage to adjacent columnar structures.

MODES FOR CARRYING OUT THE INVENTION

Figure 1:
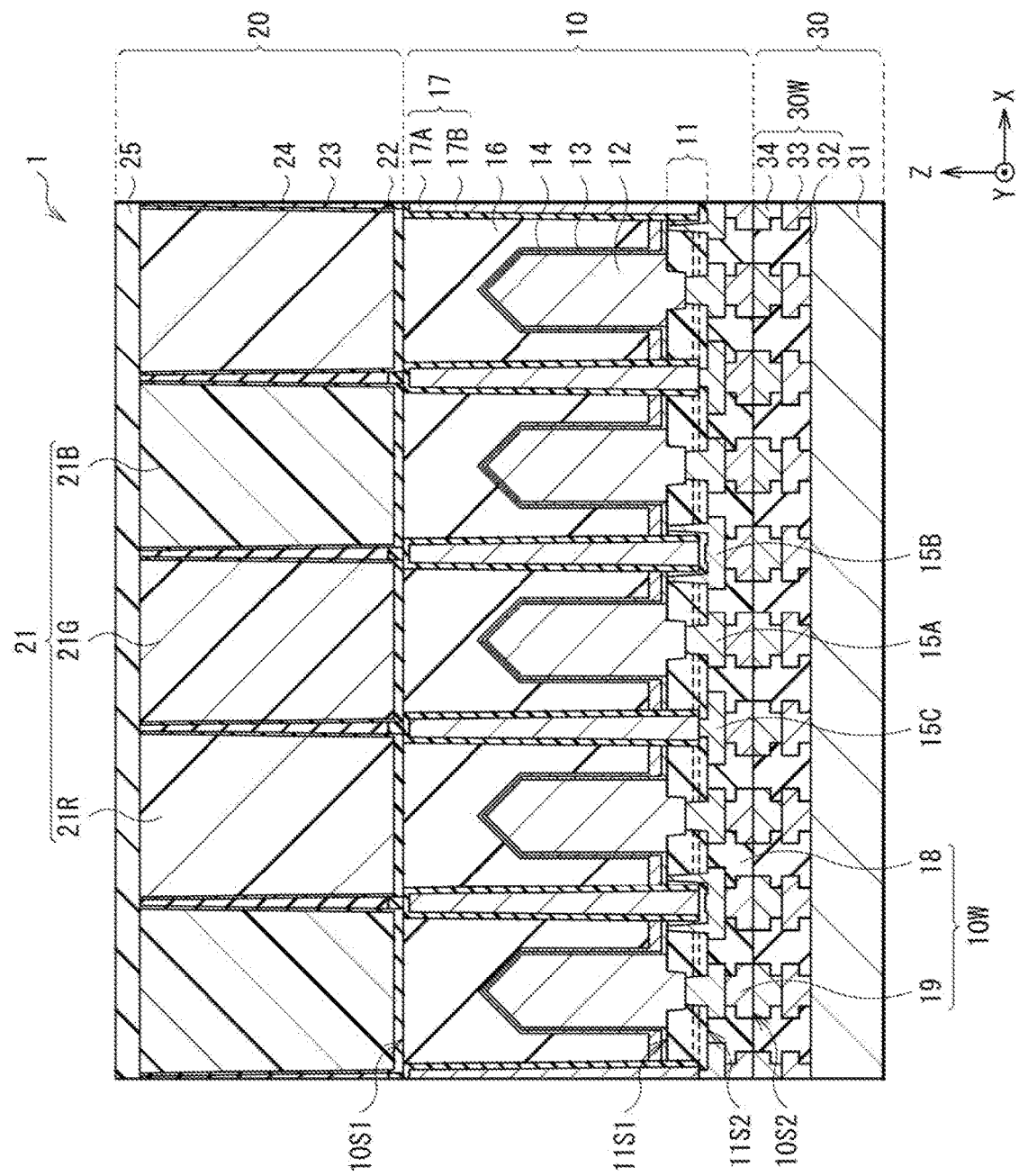
FIG. 1 is a schematic cross-sectional view of an example of a configuration of a light-emitting device according to a first embodiment of the present disclosure.

In the following, description is given in detail of embodiments of the present disclosure with reference to the drawings. The following description is merely a specific example of the present disclosure, and the present disclosure should not be limited to the following aspects. Moreover, the present disclosure is not limited to arrangements, dimensions, dimensional ratios, and the like of each component illustrated in the drawings. It is to be noted that the description is given in the following order.

1. First Embodiment (An example of a light-emitting device provided with a partition wall having an inclined surface of less than 90° between adjacent light-emitting elements)
   1-1. Configuring of Light-Emitting Device
   1-2. Method of Manufacturing Light-Emitting Device
   1-3. Configuration of Display Apparatus
   1-4. Workings and Effects
2. Modification Example 1 (An example of formation of a partition wall using a black resist)
3. Modification Example 2 (An example of using a planar type LED)
4. Modification Example 3 (Another example of a planar shape of a partition wall)
5. Second Embodiment (Another example of a light-emitting device provided with a partition wall having an inclined surface of less than 90° between adjacent light-emitting elements)
6. Modification Example 4 (Another example of a manufacturing method)
7. Modification Example 5 (An example of formation of a partition wall using logic wiring lines)
8. Modification Example 6 (Another example of display apparatus)

1. First Embodiment

Figure 2:
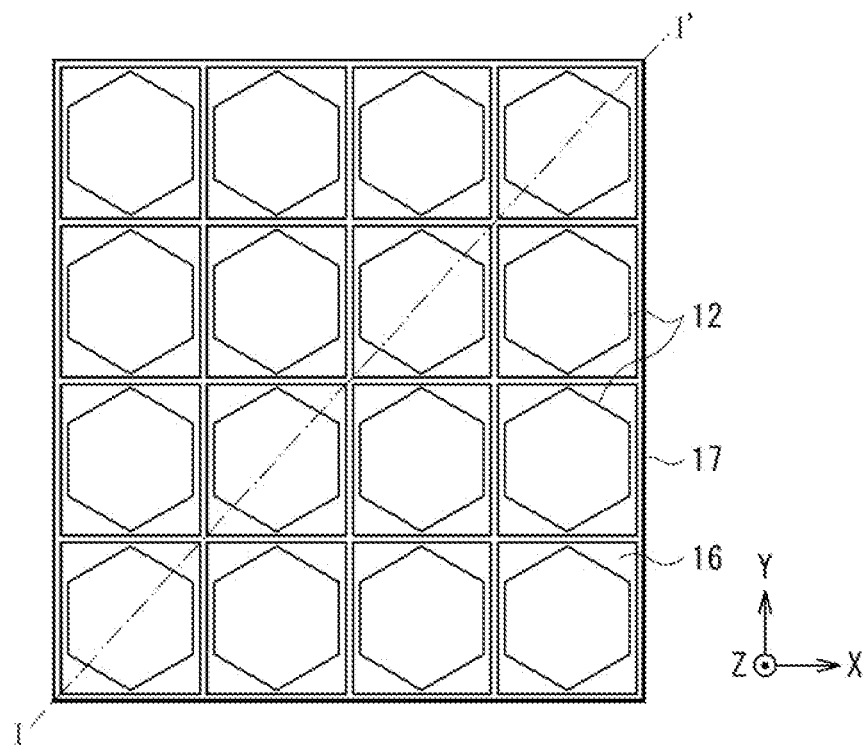
FIG. 2 is a schematic view of an example of a planar configuration of the light-emitting device illustrated in FIG. 1.

FIG. 1 schematically illustrates an example of a cross-sectional configuration of a light-emitting device (a light-emitting device 1) according to a first embodiment of the present disclosure. FIG. 2 schematically illustrates an example of a planar configuration of the light-emitting device 1 illustrated in FIG. 1, and FIG. 1 illustrates a cross-section corresponding to a line I-I' illustrated in FIG. 2. The light-emitting device 1 is suitably applicable as a display pixel of a display apparatus (e.g., an image display apparatus 100, see FIG. 5) called a so-called LED display. The light-emitting device 1 of the present embodiment has, for example, a configuration in which multiple nano-column type light-emitting elements (columnar structures 12) are provided on an insulating layer 11, and in which a partition wall 17 having an inclined surface of less than 90° relative to a surface of the insulating layer 11 is provided between adjacent columnar structures.

1-1. Configuration of Light-Emitting Device

As described above, the light-emitting device 1 includes a light-emitting section 10 including the multiple columnar structures 12, a wavelength conversion section 20 provided on a side of a light output surface 10S1 of the light-emitting section 10, and a drive substrate 30 provided on a side of a wiring layer 10E of the light-emitting section 10. Hereinafter, description is given in detail of the light-emitting section 10, the wavelength conversion section 20, and the drive substrate 30.

The light-emitting section 10 includes the insulating layer 11 having a first surface 11S1 and a second surface 11S2 opposed to each other, the multiple columnar structures 12 arranged in matrix, for example, a p-electrode 13 and a passivation film 14 covering a side surface and a top surface of each of the multiple columnar structures 12, and an n-electrode 15A penetrating the insulating layer 11 from a side of the second surface 11S2 to be in contact with the columnar structure 12, an insulating film 16 embedding the multiple columnar structures 12, and the partition wall 17 provided between adjacent columnar structures 12.

Figure 3:
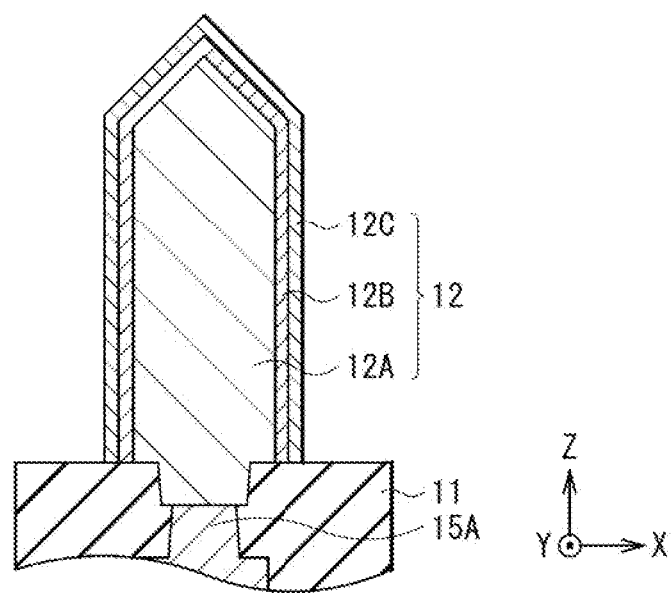
FIG. 3 is a schematic cross-sectional view of an example of a configuration of a columnar structure illustrated in FIG. 1.

FIG. 3 schematically illustrates an example of a cross-sectional configuration of the columnar structure 12. The columnar structure 12 is, for example, a nano-column type light-emitting diode (LED), and includes, for example, an n-type crystalline structure 12A, an active layer 12B, and a p-type semiconductor layer 12C.

The n-type crystalline structure 12A is provided on a buffer layer 42 stacked on a growth substrate 41, inside an opening 11H provided in a mask layer 11A, and is formed by, for example, an n-type GaN-based semiconductor material (see, e.g., FIG. 4B), although detailed description is given later. The n-type crystalline structure 12A is erected in a perpendicular direction (Z-axis direction) on the buffer layer 42 in a substantially hexagonal column shape, for example, as illustrated in FIGS. 1 and 2, and has a shape in which an area of the side surface thereof is larger than an area of the top surface thereof. This n-type crystalline structure 12A corresponds to a specific example of a "columnar crystalline structure" of the present disclosure.

The active layer 12B is provided, for example, along the side surface and the top surface of the n-type crystalline structure 12A. The active layer 12B has, for example, a multiquantum well structure in which InGaN and GaN are alternately stacked, and has a light-emitting region in the layer. For example, the active layer 12B emits light in a blue band having an emission wavelength of 430 nm or more and 500 nm or less. This active layer 12B corresponds to a specific example of an "active layer" of the present disclosure.

The p-type semiconductor layer 12C is provided along a side surface and a top surface of the active layer 12B. The p-type semiconductor layer 12C is formed by, for example, a p-type GaN-based semiconductor material. This p-type semiconductor layer 12C corresponds to a specific example of a "semiconductor layer" of the present disclosure.

The p-electrode 13 covers a periphery of the p-type semiconductor layer 12C, and is provided as a common layer for the multiple columnar structures 12. The p-electrode 13 is formed by, for example, a transparent electrode material such as ITO (Indiun Tin Oxide), IZO, SnO, or TiO.

The passivation film 14 is provided to protect the surface of the columnar structure 12, and covers a side surface and a top surface the p-electrode 13, for example; in addition, the passivation film 14 is provided as a common layer for the multiple columnar structures 12. The passivation film 14 is formed by, for example, SiO, SiN, or the like.

The n-electrodes 15A are provided independently of each other in the respective multiple columnar structures 12, and each penetrate the insulating layer 11 from the side of the second surface 11S2 of the insulating layer 11 to be in contact with the n-type crystalline structure 12A as described above. In addition, a p-electrode pad 15B penetrating the insulating layer 11 to be electrically coupled to the p-electrode 13 and a pad electrode 15C to be electrically coupled to the partition wall 17 are further provided, for example, between adjacent columnar structures 12 in the same layer as the n-electrode 15A on the side of the second surface 11S2 of the insulating layer 11. The n-electrode 15A, the p-electrode pad 15B, and the pad electrode 15C are each formed using a transparent electrode material such as ITO or IZO, for example. In addition thereto, the n-electrode 15A, the p-electrode pad 15B, and the pad electrode 15C can be formed using a metal material such as palladium (Pd), titanium (Ti), aluminum (Al), platinum (Pt), silver (Ag), nickel (Ni), or gold (Au), for example.

The insulating film 16 embeds the multiple columnar structures 12, and forms the planar light output surface 10S1 of the light-emitting section 10. The insulating film 16 is formed by, for example, SiO, SiN, or the like.

The partition wall 17 is provided to suppress occurrence of color mixture due to optical leakage to between adjacent RGB sub-pixels when applying the light-emitting device 1 to a display pixel 123 of the image display apparatus 100 described later. For example, as illustrated in FIG. 2, the partition wall 17 is provided in a grid pattern to partition the multiple columnar structures 12 arranged in matrix. In the present embodiment, the partition wall 17 has an inclined surface of less than 90° relative to the first surface 11S1 of the insulating layer 11, for example, in a cross-sectional view. That is, the partition wall 17 has a forward tapered shape in a cross-sectional view. This partition wall 17 corresponds to a specific example of a "light-blocking member" of the present disclosure.

The partition wall 17 includes, for example, a light-blocking film 17A and an insulating film 17B covering a side surface and a top surface of the light-blocking film 17A. It is preferable for the light-blocking film 17A to have a light-blocking property and to be formed using a material further having light reflectivity. Examples of such a material include Al, Ag, and rhodium (Rh). The insulating film 17B is provided to reduce galvanic corrosion between the p-electrode 13 including, for example, ITO and the light-blocking film 17A including, for example, Al, and is formed by, for example, silicon oxide (SiO), silicon nitride (SiN), or the like. As described, by forming the partition wall 17 having a forward tapered shape and further forming the light-blocking film 17A using a material having the light-blocking property and the light reflectivity, light emitted from the side surface of the columnar structure 12 is reflected by the inclined surface of the partition wall 17 to the light output surface 10S1. This improves light extraction efficiency.

In the present embodiment, the partition wall 17 penetrates the insulating layer 11, and the bottom of the light-blocking film 17A is exposed to the side of the second surface 11S2 of the insulating layer 11. The light-blocking film 17A is electrically coupled to, for example, the pad electrode 15C described later, and is coupled to, for example, GND. This suppresses abnormal electric discharge in the light-blocking film 17A.

The light-emitting section 10 further includes a wiring layer 10W on the side of the second surface 11S2 of the insulating layer 11. The wiring layer 10W forms a bonded surface 10S2 with the drive substrate 30. The wiring layer 10W includes, in an insulating layer 18, multiple contact electrodes 19 to be each electrically coupled to the n-electrode 15A, the p-electrode pad 15B, and the pad electrode 15C. The multiple contact electrodes 19 are each configured by, for example, a copper (Cu) pad, and exposed to the bonded surface 10S2. These multiple contact electrodes 19 correspond to a specific example of "first contact electrodes" of the present disclosure.

The wavelength conversion section 20 includes color conversion layers 21 (a red color conversion layer 21R, a green color conversion layer 21G, and a blue color conversion layer 21B) disposed above the multiple columnar structures 12, an insulating film 22 and a separation part 23 disposed between the color conversion layers 21R, 21G, and 21B, an insulating film 24 covering side surfaces of the insulating film 22 and the separation part 23, and a protective layer 25.

The color conversion layers 21 (red color conversion layer 21R, green color conversion layer 21G, and blue color conversion layer 21B) are each provided to convert light emitted from the multiple columnar structures 12 into a desired wavelength (e.g., red (R)/green (G)/blue (B)) for emission. The red color conversion layer 21R, the green color conversion layer 21G, and the blue color conversion layer 21B can be formed to include and using quantum dots corresponding to the respective colors. Specifically, in a case where red light is obtained, the quantum dots can be selected from InP, GaInP, InAsP, CdSe, CdZnSe, CdTeSe, CdTe, or the like, for example. In a case where green light is obtained, the quantum dots can be selected from InP, GaInP, ZnSeTe, ZnTe, CdSe, CdZnSe, CdS CdSeS, or the like, for example. In a case where blue light is obtained, the quantum dots can be selected from ZnSe, ZnTe, ZnSeTe, CdSe, CdZnSe, CdS, CdZnS, CdSeS, and the like. It is to be noted that, in a case where blue light is emitted from the columnar structure 12 as described above, the blue color conversion layer 21B may be formed by a resin layer having light transmissivity.

Similarly to the partition wall 17 described above, the separation part 23 is provided to suppress occurrence of color mixture due to optical leakage to between adjacent RGB sub-pixels when applying the light-emitting device 1 to the display pixel 123 of the image display apparatus 100. The separation part 23 includes, for example, a silicon (Si) substrate 23A and a light-blocking film (unillustrated) having a light-blocking property and light reflectivity, for example, which are described later.

The insulating films 22 and 24 are each formed by, for example, SiO, SiN, or the like. The protective layer 25 is provided to protect a surface of the light-emitting device 1, and is formed by, for example, SiO, SiN, or the like.

The drive substrate 30 includes a semiconductor substrate 31 and a wiring layer 30W to be in contact with the bonded surface 10S2 of the light-emitting section 10. In the wiring layer 30W, for example, multiple wiring lines 33 and multiple contact electrodes 34 are stacked in order inside an insulating layer 32 from a side of the semiconductor substrate 31. Similarly to the multiple contact electrodes 19 described above, the multiple contact electrodes 34 are each configured by, for example, a copper (Cu) pad, and exposed to a surface of the insulating layer 32. These multiple contact electrodes 34 correspond to a specific example of "second contact electrodes" of the present disclosure.

1-2. Method of Manufacturing Light-Emitting Device

Figure 4A:
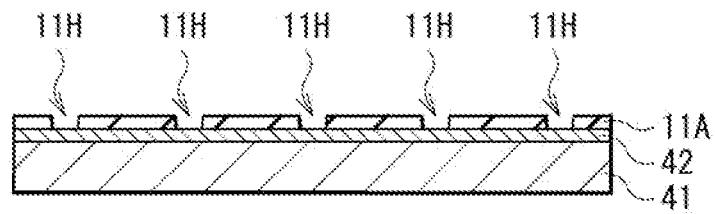
FIG. 4A is an explanatory schematic cross-sectional view of an example of a step of manufacturing the light-emitting device illustrated in FIG. 1.

The light-emitting device 1 can be produced, for example, as follows. FIGS. 4A to 4N illustrate a method of manufacturing the light-emitting device 1 in the order of steps.

First, as illustrated in FIG. 4A, the buffer layer 42 is formed on the growth substrate 41, and then, for example, a chemical vapor deposition method (CVD method) is used to form the mask layer 11A having the opening 11H at a predetermined position, for example, on the buffer layer 42.

Figure 4B:
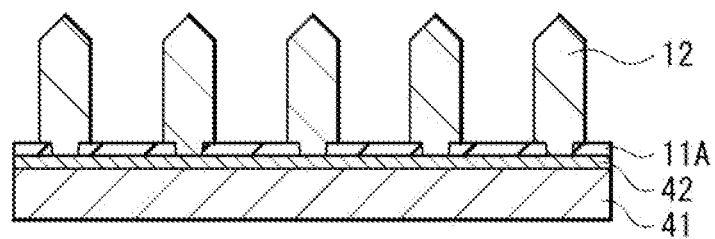
FIG. 4B is a schematic cross-sectional view of a step subsequent to FIG. 4A.
Figure 4C:
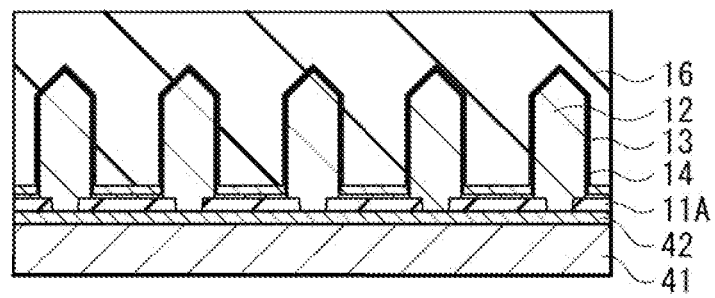
FIG. 4C is a schematic cross-sectional view of a step subsequent to FIG. 4B.

Subsequently, as illustrated in FIG. 4B, the n-type crystalline structure 12A, the active layer 12B, and the p-type semiconductor layer 12C are sequentially grown on the buffer layer 42 exposed inside the opening 11H by means of epitaxial growth to form the columnar structure 12. Next, as illustrated in FIG. 4C, for example, an atomic layer deposition method (ALD method) is used to form, as a film, the p-electrode 13 which is continuous on the top surface and the side surface of the columnar structure 12 and on the mask layer 11A, and then the passivation film 14 is formed on the p-electrode 13. Further, as illustrated in FIG. 4C, for example, a CVD method is used to form the insulating film 16 including, for example, SiO on the passivation film 14 to embed the columnar structure 12, and then, for example, a CMP (Chemical Mechanical Polishing) method is used to planarize a surface of the insulating film 16.

Figure 4D:
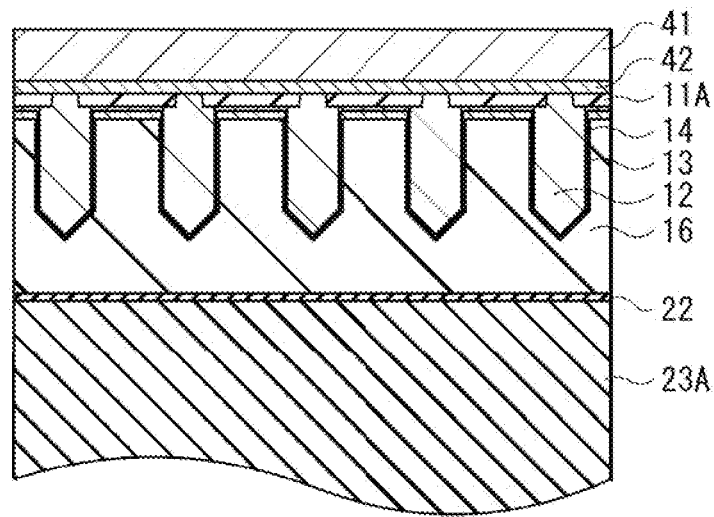
FIG. 4D is a schematic cross-sectional view of a step subsequent to FIG. 4C.
Figure 4E:
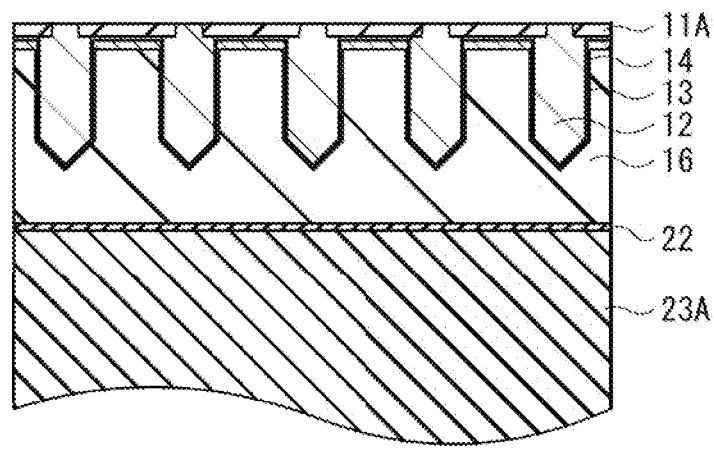
FIG. 4E is a schematic cross-sectional view of a step subsequent to FIG. 4D.
Figure 4F:
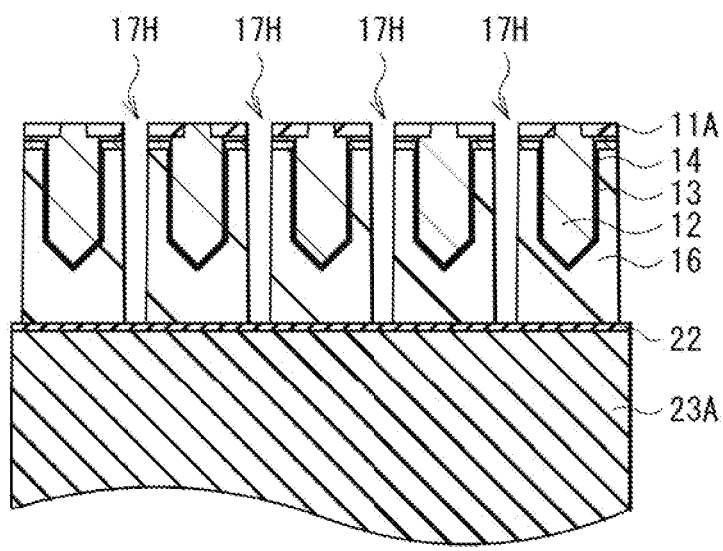
FIG. 4F is a schematic cross-sectional view of a step subsequent to FIG. 4E.

Subsequently, as illustrated in FIG. 4D, an Si substrate 23A is attached onto the insulating film 16 with the insulating film 22 interposed therebetween, and then inversion is performed. Next, as illustrated in FIG. 4E, the growth substrate 41 and the buffer layer 42 are removed as illustrated in FIG. 4F, and then an opening 17H penetrating the mask layer 11A, the p-electrode 13, the passivation film 14, and the insulating film 16 is formed, between adjacent columnar structures 12, from a side of the mask layer 11A as illustrated in FIG. 4F.

Figure 4G:
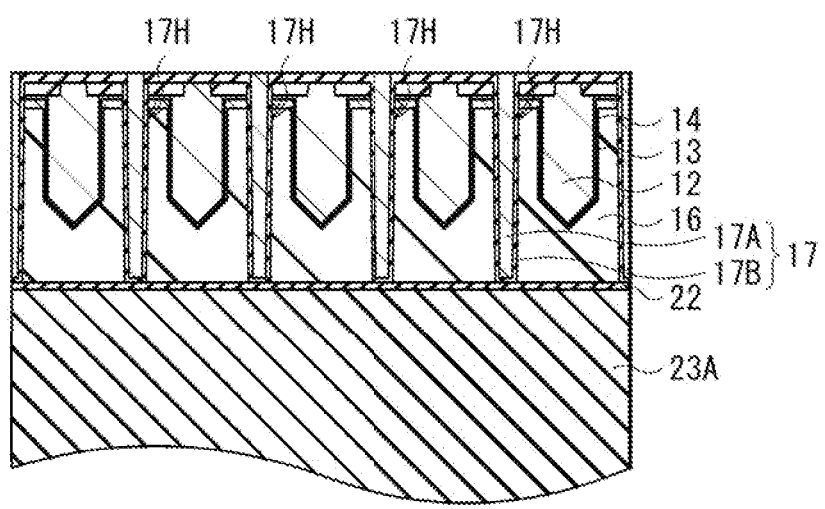
FIG. 4G is a schematic cross-sectional view of a step subsequent to FIG. 4F.

Subsequently, as illustrated in FIG. 4G, for example, an ALD method is used to form the insulating film 17B including, for example, SiO on the mask layer 11A, the n-type crystalline structure 12A of the columnar structure 12, and a side surface and a bottom surface of the opening 17H. Next, similarly, the light-blocking film 17A including, for example, Al is formed to fill the opening 17H, and then, for example, etch-back is used to remove the light-blocking film 17A formed outside the opening 17H.

Figure 4H:
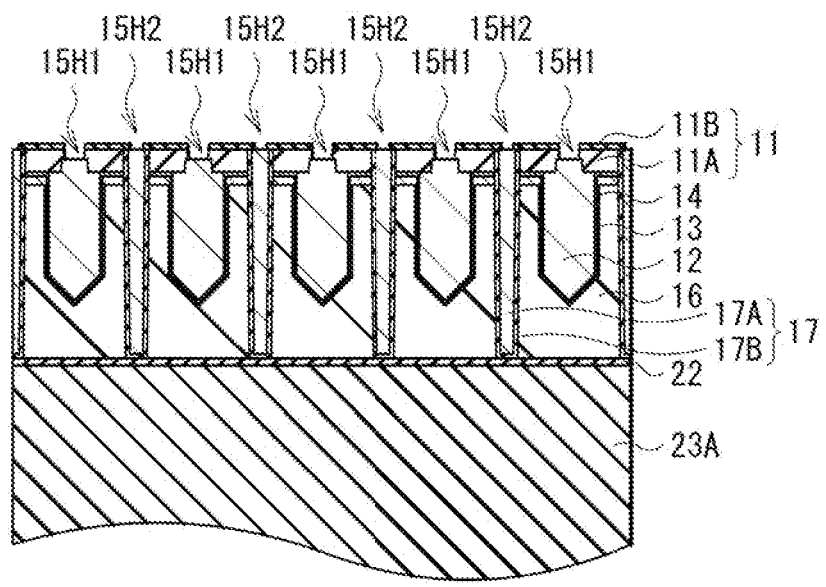
FIG. 4H is a schematic cross-sectional view of a step subsequent to FIG. 4G.
Figure 4I:
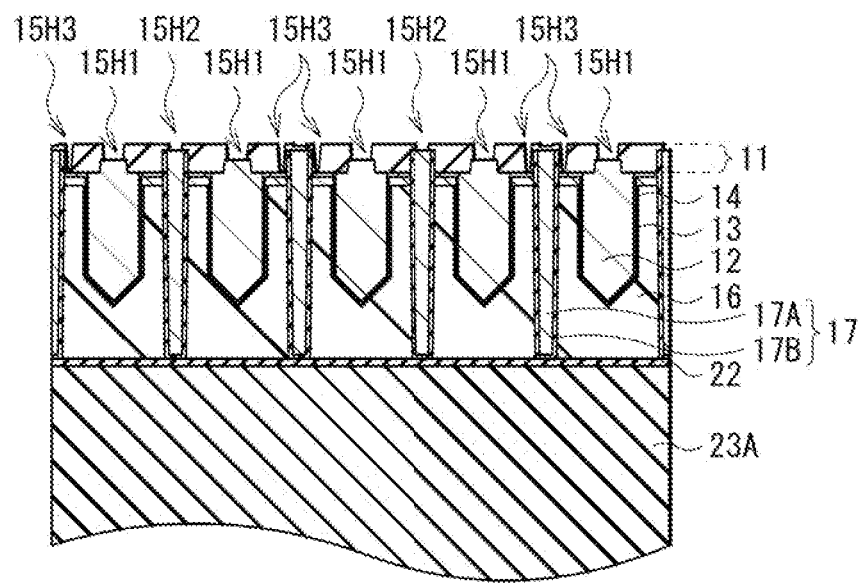
FIG. 4I is a schematic cross-sectional view of a step subsequent to FIG. 4H.

Subsequently, an insulating film including, for example, SiO is further formed on the light-blocking film 17A and the insulating film 17B, and then, as illustrated in FIG. 4H, for example, photolithography and etching are used to form openings 15H1 and 15H2 exposing the n-type crystalline structure 12A of the columnar structure 12 and the light-blocking film 17A, respectively. Next, as illustrated in FIG. 4I, for example, photolithography and etching are used to form an opening 15H3 exposing the p-electrode 13.

Figure 4J:
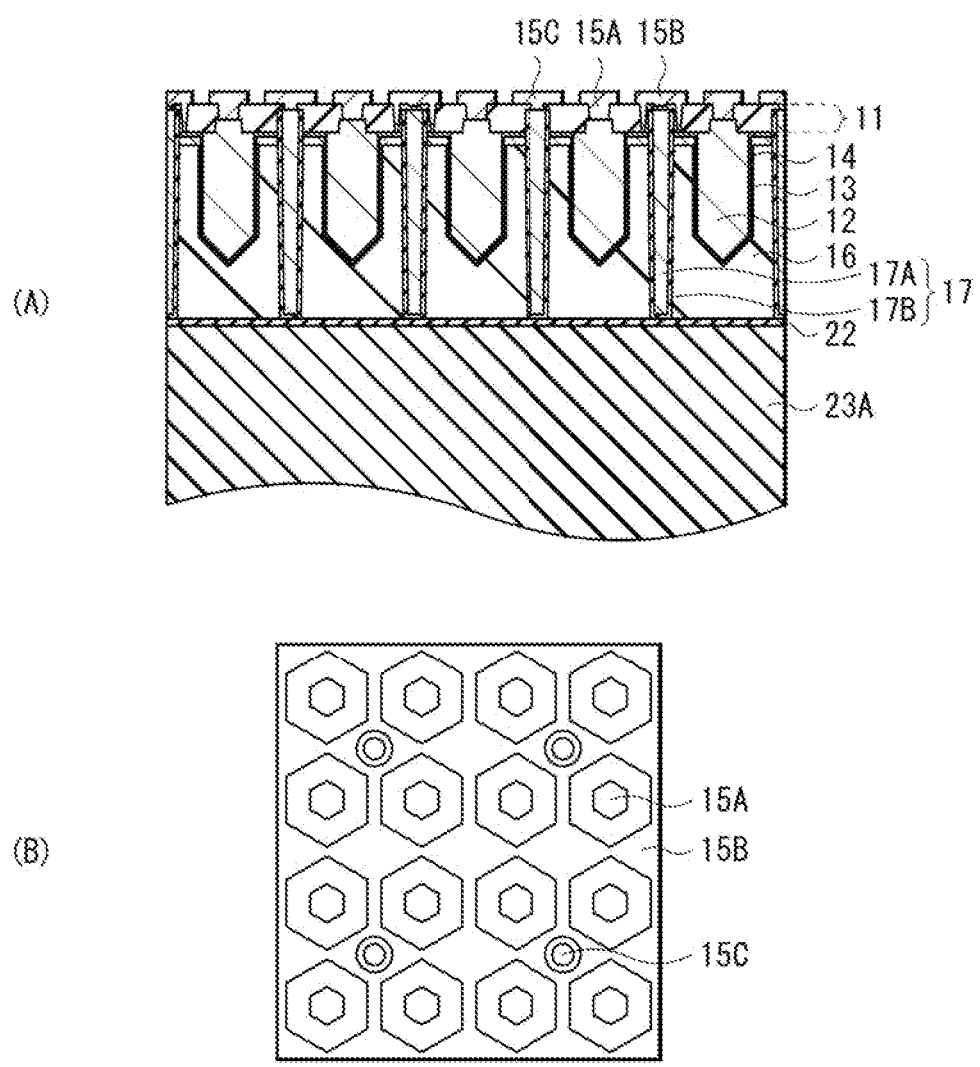
FIG. 4J is a schematic cross-sectional view of a step subsequent to FIG. 4I.

Subsequently, as illustrated in a cross-sectional view (A) and a plan view (B) of FIG. 4J, for example, a sputtering method is used to form a metal film including, for example, Ti inside the openings 15H1, 15H2, and 15H3, and then patterning is performed by photolithography and etching to form the n-electrode 15A, the p-electrode pad 15B, and the pad electrode 15C, respectively.

Figure 4K:
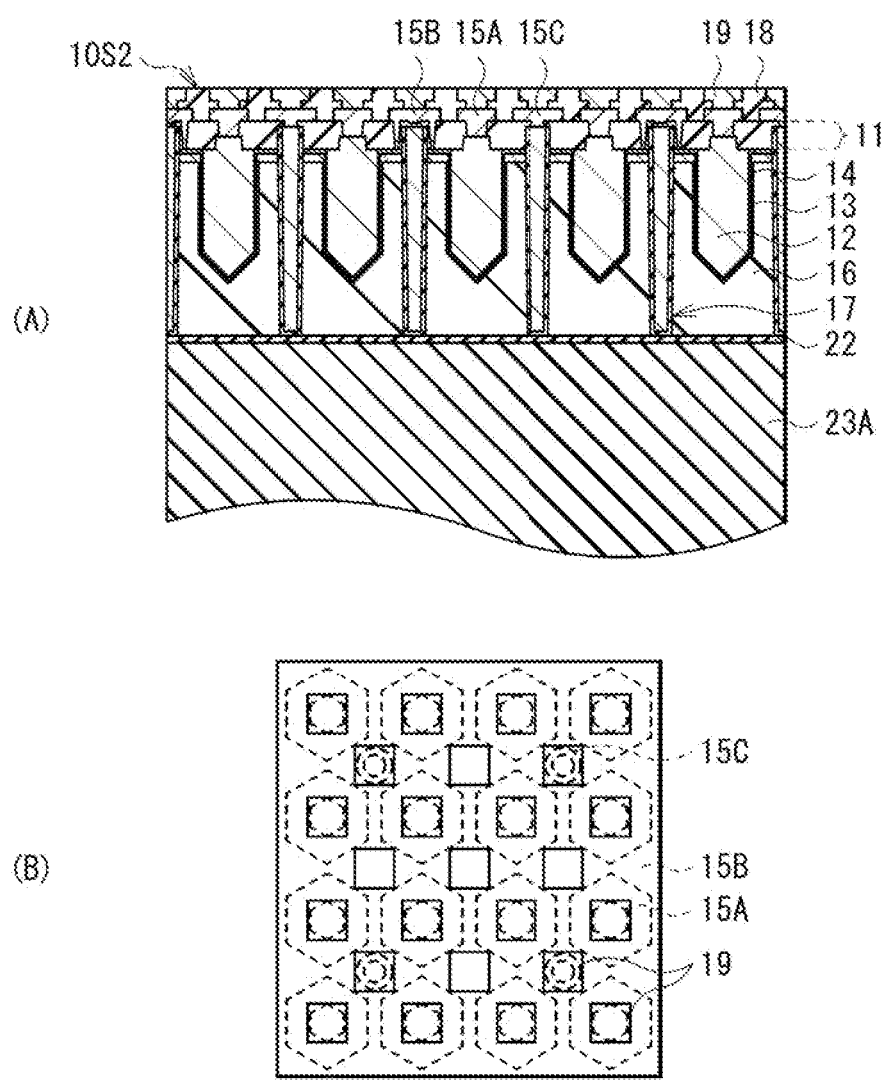
FIG. 4K is a schematic cross-sectional view of a step subsequent to FIG. 4J.

Next, as illustrated in a cross-sectional view (A) and a plan view (B) of FIG. 4K, for example, a CVD method is used to form the insulating layer 18 including, for example, SiO to cover the insulating layer 11, the n-electrode 15A, the p-electrode pad 15B, and the pad electrode 15C. Thereafter, a method similar to that described above is used to form the contact electrode 19 to be electrically coupled to each of the n-electrode 15A, the p-electrode pad 15B, and the pad electrode 15C, and a surface thereof is planarized to form the bonded surface 10S2.

Figure 4L:
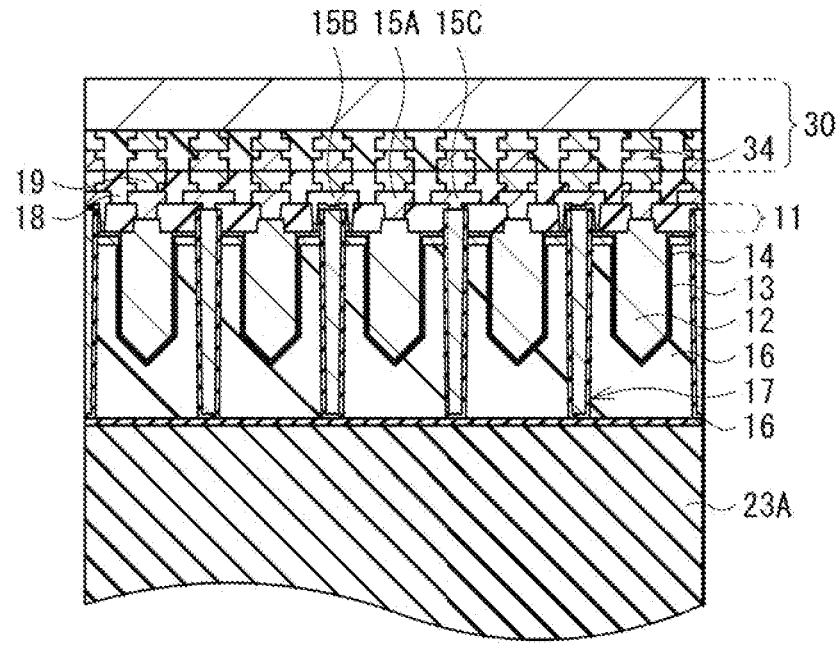
FIG. 4L is a schematic cross-sectional view of a step subsequent to FIG. 4K.

Subsequently, as illustrated in FIG. 4L, the contact electrode 19 exposed to the bonded surface 10S2 and the contact electrode 34 exposed to a surface of the wiring layer 30W of the drive substrate 30 prepared separately are attached together by Cu—Cu bonding, for example.

Figure 4M:
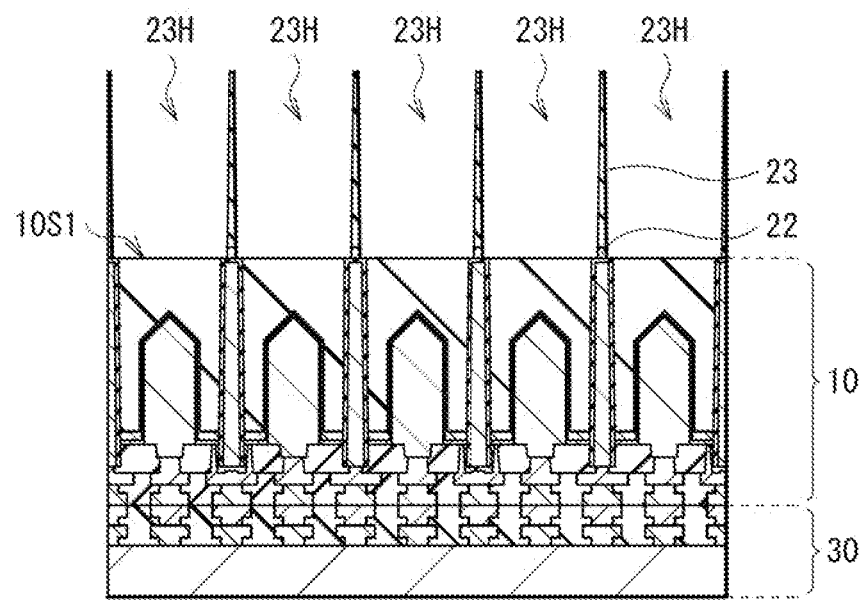
FIG. 4M is a schematic cross-sectional view of a step subsequent to FIG. 4L.
Figure 4N:
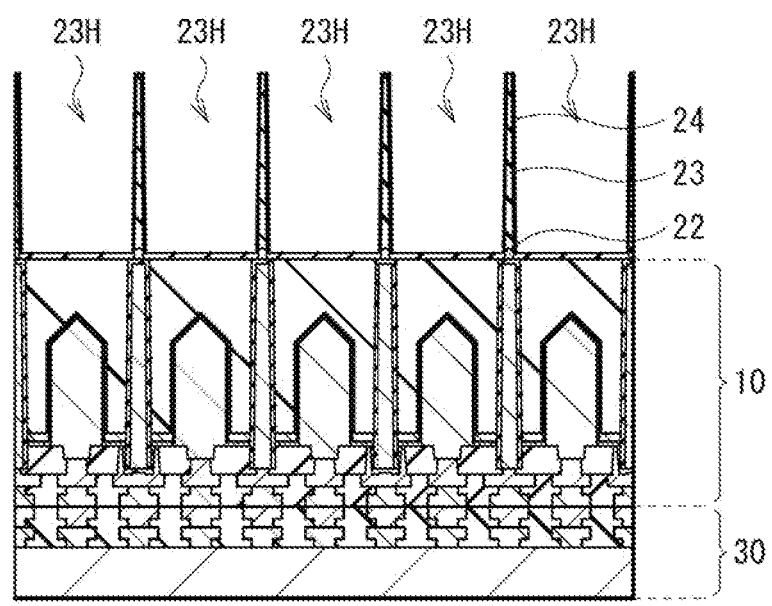
FIG. 4N is a schematic cross-sectional view of a step subsequent to FIG. 4M.

Next, as illustrated in FIG. 4M, the Si substrate 23A is worked to form an opening 23H above each of the columnar structures 12. Then, for example, formation of an oxide film such as SiO and etch-back as well as formation of a light-blocking film and etch-back allow for formation of the separation part 23 above the partition wall 17, for example. Subsequently, as illustrated in FIG. 4N, the insulating film 24 including, for example, SiO is formed, which is continuous on the side surface and a top surface of the separation parts 23 and between the separation parts 23. Thereafter, corresponding color conversion layers 21 (red color conversion layer 21R, green color conversion layer 21G, and blue color conversion layer 21B) are formed inside the opening 23H, and then the protective layer 25 is formed. Through the above-described steps, the light-emitting device 1 illustrated in FIG. 1 is completed.

1-3. Configuration of Display Apparatus

Figure 5:
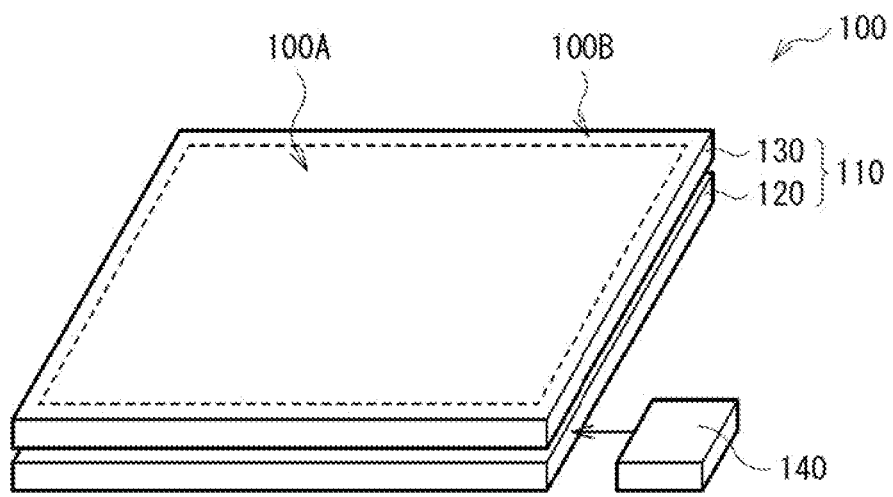
FIG. 5 is a perspective view of an example of a configuration of a display apparatus including the light-emitting device of the present disclosure.

FIG. 5 is a perspective view of an example of an outline configuration of a display apparatus (image display apparatus 100) of the present disclosure. The image display apparatus 100 is called a so-called LED display, and uses the light-emitting device 1 of the present embodiment as a display pixel. As illustrated in FIG. 5, for example, the image display apparatus 100 includes a display panel 110 and a control circuit 140 that drives the display panel 110.

The display panel 110 includes a mounting substrate 120 and a counter substrate 130 which are overlapped each other. The counter substrate 130 has a surface serving as a picture display surface, and has a display region 100A at a middle portion thereof as well as a frame region 100B being a non-display region around the display region 100A.

Figure 6:
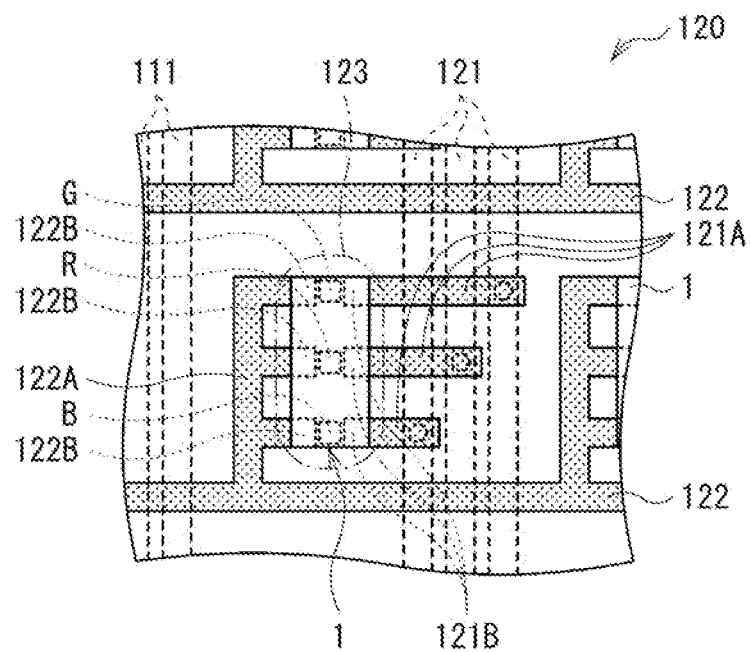
FIG. 6 is a schematic view of an example of a wiring layout of the image display apparatus illustrated in FIG. 5.

FIG. 6 illustrates an example of a wiring layout of a region, corresponding to the display region 100A, of a surface of the mounting substrate 120 on a side of the counter substrate 130. In the region, corresponding to the display region 100A, of the surface of the mounting substrate 120, for example, as illustrated in FIG. 6, multiple data wiring lines 121 are formed to extend in a predetermined direction, and are arranged in parallel at a predetermined pitch. In the region, corresponding to the display region 100A, of the surface of the mounting substrate 120, for example, multiple scan wiring lines 122 are further formed to extend in a direction intersecting (e.g., orthogonal to) the data wiring lines 121, and are arranged in parallel at a predetermined pitch. The data wiring line 121 and the scan wiring line 122 each include, for example, an electrically-conductive material such as Cu (copper).

The scan wiring lines 122 are formed on, for example, an uppermost layer, and is formed on, for example, an insulating layer (unillustrated) formed on a surface of a base material. It is to be noted that a base material of the mounting substrate 120 includes, for example, a silicon substrate, a resin substrate, or the like, and that the insulating layer on the base material includes, for example, silicon nitride (SiN), silicon oxide (SiO), aluminum oxide (AlO), or a resin material. Meanwhile, the data wiring lines 121 are formed inside a layer different from the uppermost layer including the scan wiring lines 122 (e.g., a layer under the uppermost layer), and is formed, for example, inside the insulating layer on the base material.

A periphery of an intersecting portion of the data wiring line 121 and the scan wiring line 122 corresponds to the display pixel 123, and multiple display pixels 123 are arranged in a matrix shape within the display region 100A. Each of the display pixels 123 is mounted with the light-emitting device 1 including light-emitting sections corresponding to R, G, and B, for example. It is to be noted that FIG. 6 exemplifies a case where three light-emitting sections R, G, and B constitute one display pixel 123 to enable the light-emitting section R, the light-emitting section G, and the light-emitting section B to output red light, green light, and blue light, respectively.

The light-emitting device 1 is provided with, for example, a pair of terminal electrodes disposed for each of the light-emitting sections R, G, and B, or provided with terminal electrodes one of which is shared by the light-emitting sections R, G, and B and another of which is disposed for each of the light-emitting sections R, G, and B. In addition, the one of the terminal electrodes is electrically coupled to the data wiring line 121, and the other of the terminal electrodes is electrically coupled to the scan wiring line 122. For example, the one of the terminal electrodes is electrically coupled to a pad electrode 121B at the tip of a branch 121A provided in the data wiring line 121. Further, for example, the other of the terminal electrodes is electrically coupled to a pad electrode 122B at the tip of a branch 122A provided in the scan wiring line 122.

Each of the pad electrodes 121B and 122B is formed, for example, in the uppermost layer, and is provided, for example, at a location where each light-emitting device 1 is mounted, as illustrated in FIG. 6. Here, the pad electrodes 121B and 122B each include, for example, an electrically-conductive material such as Au (gold).

The mounting substrate 120 is further provided with, for example, multiple support columns (unillustrated) to regulate an interval between the mounting substrate 120 and the counter substrate 130. The support column may be provided within a region facing the display region 100A, or may be provided within a region facing the frame region 100B.

The counter substrate 130 includes, for example, a glass substrate, a resin substrate, or the like. A surface of the counter substrate 130 on a side of the light-emitting device 1 may be planar, but is preferably a rough surface. The rough surface may be provided across the entire region facing the display region 100A, or may be provided only in a region facing the display pixel 123. The rough surface has fine unevenness on which light beams emitted from the light-emitting sections R, G, and B are incident on the rough surface. The unevenness of the rough surface can be prepared by, for example, sandblasting, dry etching, or the like.

The control circuit 140 drives each display pixel 123 (each light-emitting device 1) on the basis of a picture signal. The control circuit 140 is configured by, for example, a data driver that drives the data wiring lines 121 coupled to the display pixel 123 and a scan driver that drives the scan wiring lines 122 coupled to the display pixel 123. For example, as illustrated in FIG. 5, the control circuit 140 may be provided separately from the display panel 110 and coupled to the mounting substrate 120 via a wiring line, or may be mounted on the mounting substrate 120.

1-4. Workings and Effects

In the present embodiment, for example, the partition wall 17 having an inclined surface of less than 90° relative to the first surface 11S1 of the insulating layer 11 is provided between adjacent columnar structures 12. This suppresses optical leakage to adjacent RGB sub-pixels when using the light-emitting device 1 in the display pixel 123 of the image display apparatus 100, for example.

As described above, it is possible, in the light-emitting device 1 of the present embodiment, to suppress occurrence of color mixture. Thus, it is possible to improve display quality of the image display apparatus 100 including the light-emitting device 1.

In addition, in the present embodiment, the light-blocking film 17A constituting the partition wall 17 is formed using a material having light reflectivity in addition to a light-blocking property. This allows light emitted from the side surface of the columnar structure 12 to be reflected by the inclined surface of the partition wall 17 to the light output surface 10S1. Thus, it is possible to improve light extraction efficiency.

Further, in the present embodiment, the multiple columnar structures 12 are formed, and then formation is performed from the side of the surface (second surface 11S2 of insulating layer 11) on a side opposite to the light output surface 10S1, thus making it possible to easily form the partition wall 17 having a forward tapered shape in which the inclined surface has an angle of less than 90° as described above. In addition, for example, fine working is possible as compared with a case where the formation is performed prior to the multiple columnar structures 12.

Furthermore, in the present embodiment, the pad electrode 15C is coupled to the light-blocking film 17A constituting the partition wall 17 to apply a fixed potential, thus suppressing abnormal electric discharge due to a floating state. Thus, it is possible to improve reliability of the image display apparatus 100 including the same.

In addition, in the present embodiment, the p-electrode 13 is used as a common electrode for the multiple columnar structures 12, and the p-electrode pad 15B to be electrically coupled to the p-electrode 13 is further provided on the side of the second surface 11S2 of the insulating layer 11 immediately below the partition wall 17, thus making it possible to achieve a narrower pitch. This makes it possible to achieve higher definition in the image display apparatus 100 including the same.

Next, description is given of a second embodiment of the present disclosure and modification examples (Modification Example 1 to 6). Hereinafter, components similar to those of the foregoing first embodiment are denoted by the same reference numerals, and descriptions thereof are omitted as appropriate.

2. Modification Example 1

Figure 7:
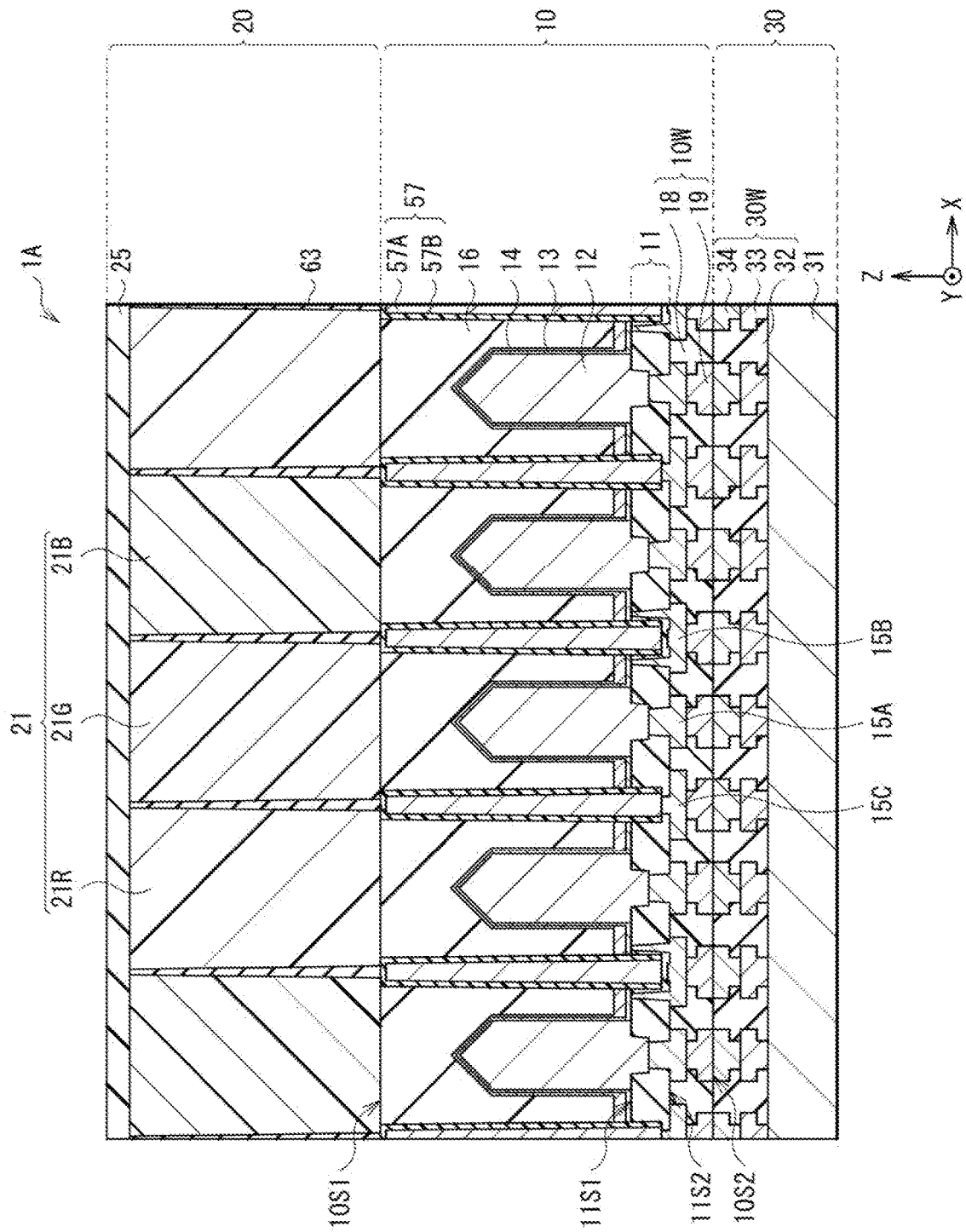
FIG. 7 is a schematic cross-sectional view of an example of a configuration of a light-emitting device according to Modification Example 1 of the present disclosure.

FIG. 7 schematically illustrates an example of a cross-sectional configuration of a light-emitting device (a light-emitting device 1A) according to Modification Example 1 of the present disclosure. The light-emitting device 1A of the present modification example differs from the foregoing first embodiment in that a light-blocking film 57A of a partition wall 57 and a separation part 63 are each formed using, for example, a resin material such as a black resist.

As described above, the foregoing first embodiment has given the example in which the partition wall 17 is configured by the light-blocking film 17A having a light-blocking property and light reflectivity and the insulating film 17B provided therearound and the example in which the separation part 23 is configured by the Si substrate and the light-blocking film having a light-blocking property and light reflectivity. However, this is not limitative.

It is to be noted that, in a case where a black resist is used to form the partition wall 57 as in the present modification example, the pad electrode 15C for applying a fixed potential to the partition wall 17 formed in the foregoing first embodiment and the contact electrode 19 to be electrically coupled thereto can be omitted.

In addition, the separation part 23 need not have both the light-blocking property and the light-reflectivity. For example, the light-blocking film constituting the separation part 23 may be omitted, for example, in the foregoing first embodiment. In that case, the separation part 23 may be configured by a worked Si substrate and an insulating film including, for example, SiO or the like, or may be configured only by a worked Si substrate.

3. Modification Example 2

Figure 8A:
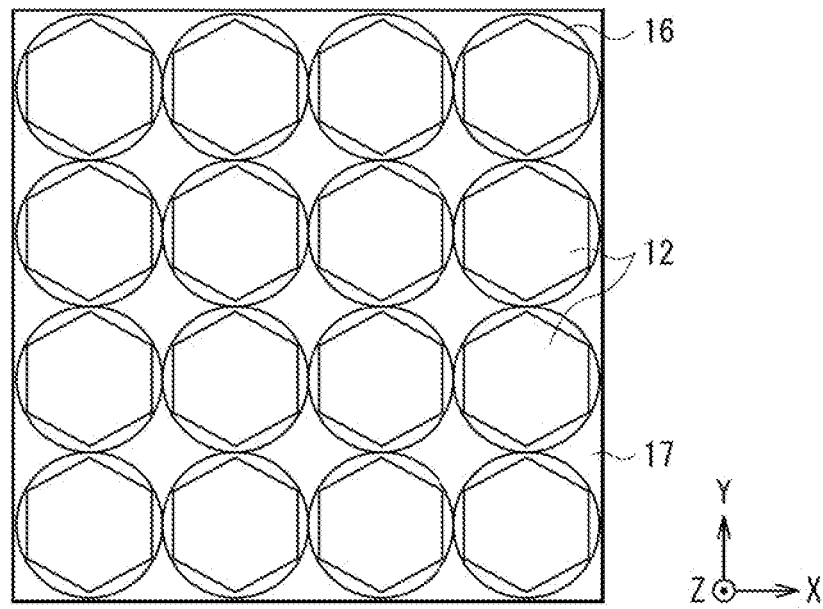
FIG. 8A is a schematic view of an example of a planar configuration of a configuration of a light-emitting device according to Modification Example 2 of the present disclosure.
Figure 8B:
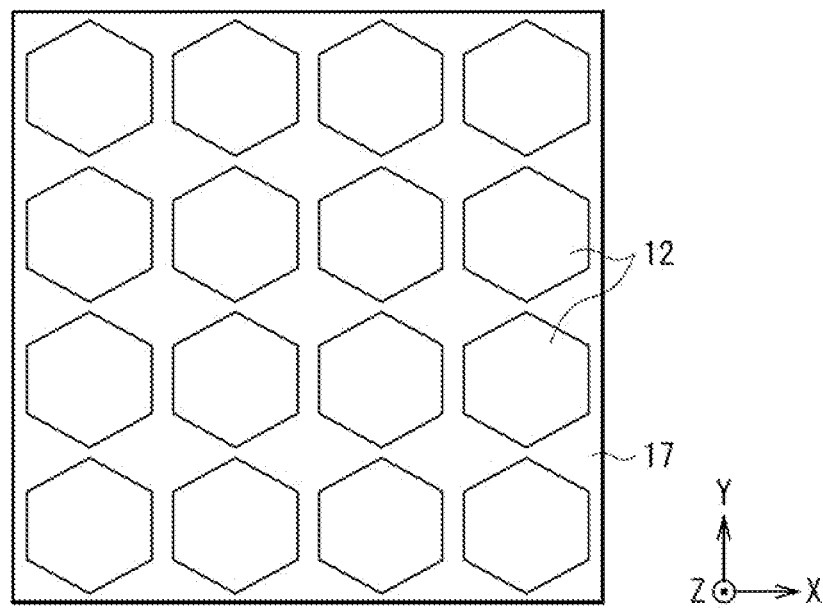
FIG. 8B is a schematic view of another example of the planar configuration of the configuration of the light-emitting device according to Modification Example 2 of the present disclosure.

FIGS. 8A and 8B each schematically illustrate another example of the planar configuration of the light-emitting device 1 of the foregoing first embodiment. The foregoing first embodiment has given the example in which the partition wall 17 is provided, for example, in a grid pattern between adjacent columnar structures 12; however, this is not limitative.

For example, as illustrated in FIG. 8A, the partition wall 17 may be formed to surround each of the multiple columnar structures 12 in a circular shape in a plan view. Alternatively, for example, as illustrated in FIG. 8B, each of the multiple columnar structures 12 may be formed in a polygonal shape in a plan view. It is to be noted that, as illustrated in FIG. 8B, in a case of adopting a hexagonal shape similarly to the planar shape of the columnar structure 12, the insulating film 16 covering the side surface of the columnar structure 12 may be omitted so as to form the columnar structure 12 to allow the side surface of the columnar structure 12 and the partition wall 17 to be in contact with each other.

4. Modification Example 3

Figure 9:
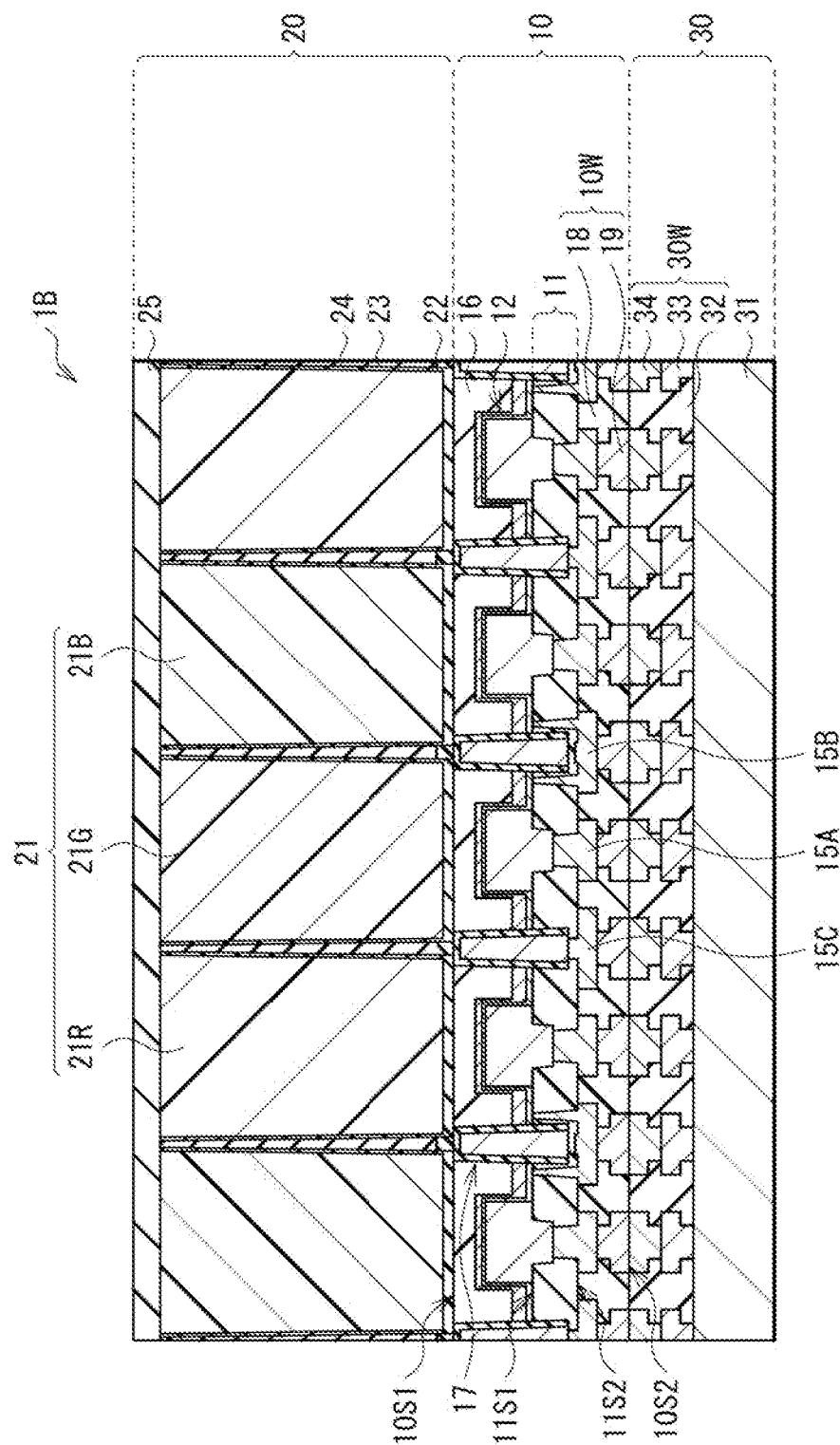
FIG. 9 is a schematic cross-sectional view of an example of a configuration of a light-emitting device according to Modification Example 3 of the present disclosure.

FIG. 9 schematically illustrates an example of a cross-sectional configuration of a light-emitting device 1B according to Modification Example 3 of the present disclosure. The foregoing first embodiment has given the example of using the nano-column type light-emitting element (columnar structure 12). However, the present technology is applicable also to a planar type light-emitting element as illustrated in FIG. 9, and is able to achieve effects similar to those of the foregoing first embodiment.

5. Second Embodiment

Figure 10:
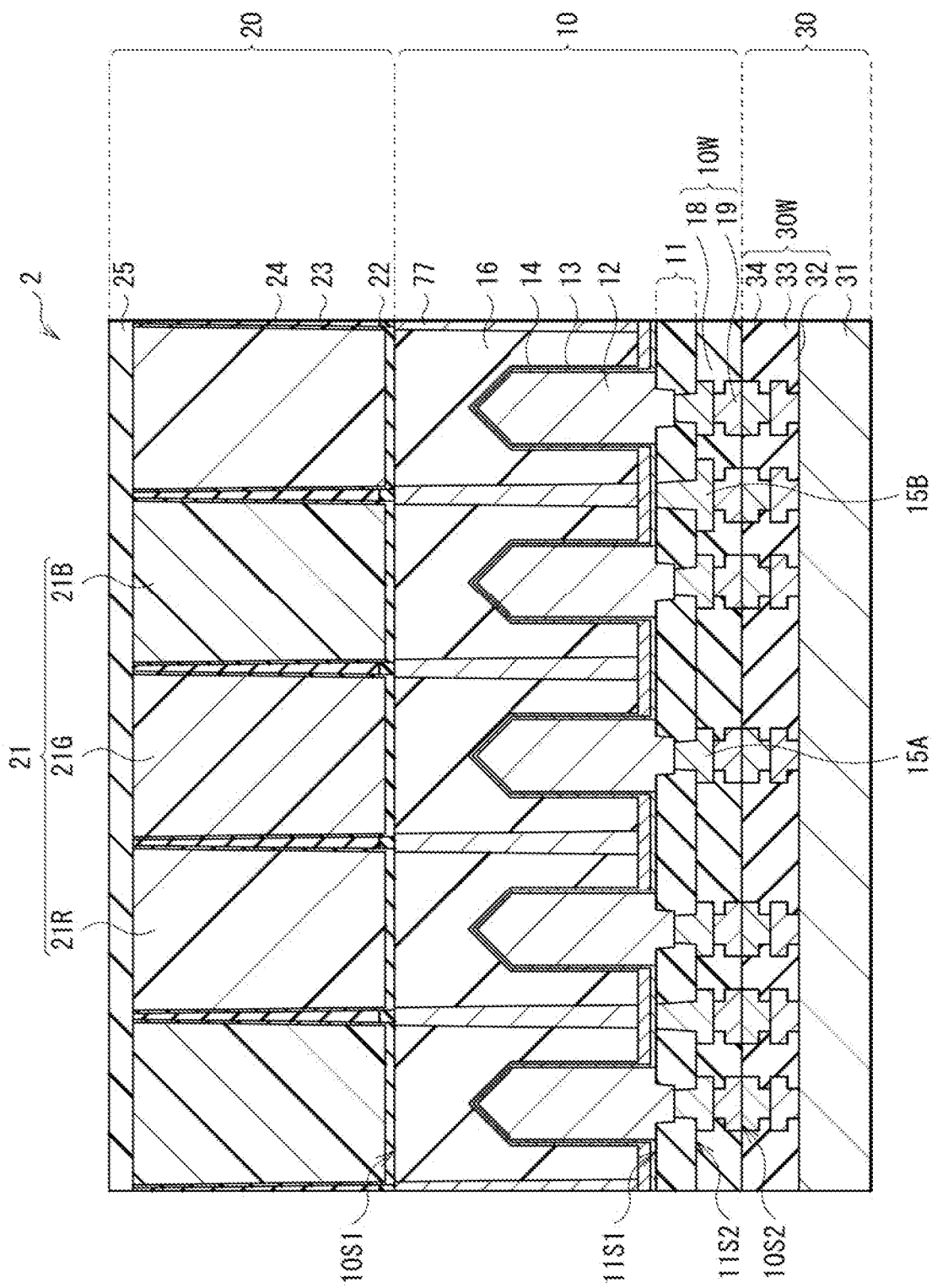
FIG. 10 is a schematic cross-sectional view of an example of a configuration of a light-emitting device according to a second embodiment of the present disclosure.

FIG. 10 schematically illustrates an example of a cross-sectional configuration of a light-emitting device (a light-emitting device 2) according to a second embodiment of the present disclosure. Similarly to the foregoing first embodiment, the light-emitting device 2 is suitably applicable as a display pixel of a display apparatus (e.g., image display apparatus 100) called a so-called LED display. The light-emitting device 2 of the present embodiment differs from the foregoing first embodiment in that, for example, a partition wall 77 is formed from the side of the light output surface 10S1.

Figure 11A:
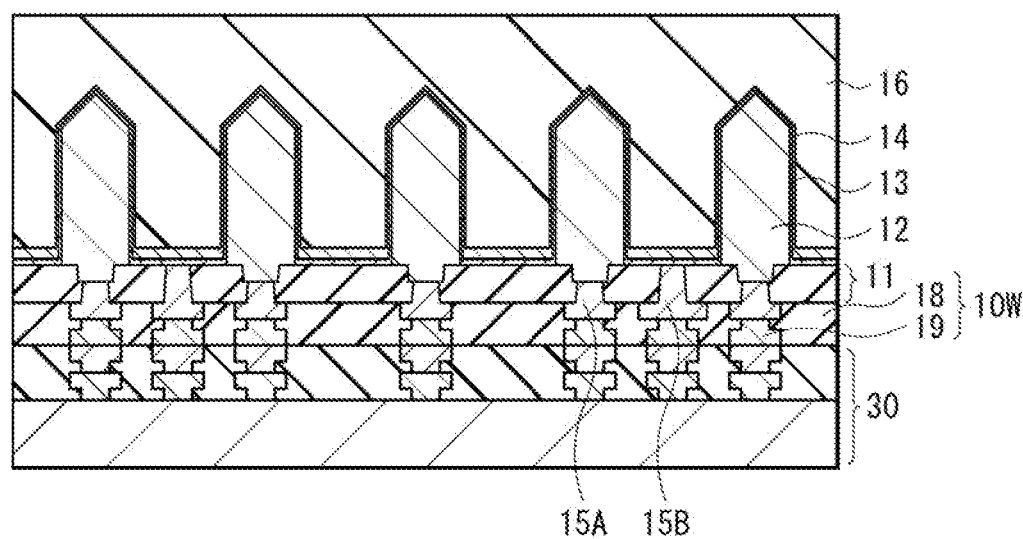
FIG. 11A is an explanatory schematic cross-sectional view of an example of a step of manufacturing the light-emitting device illustrated in FIG. 10.
Figure 11B:
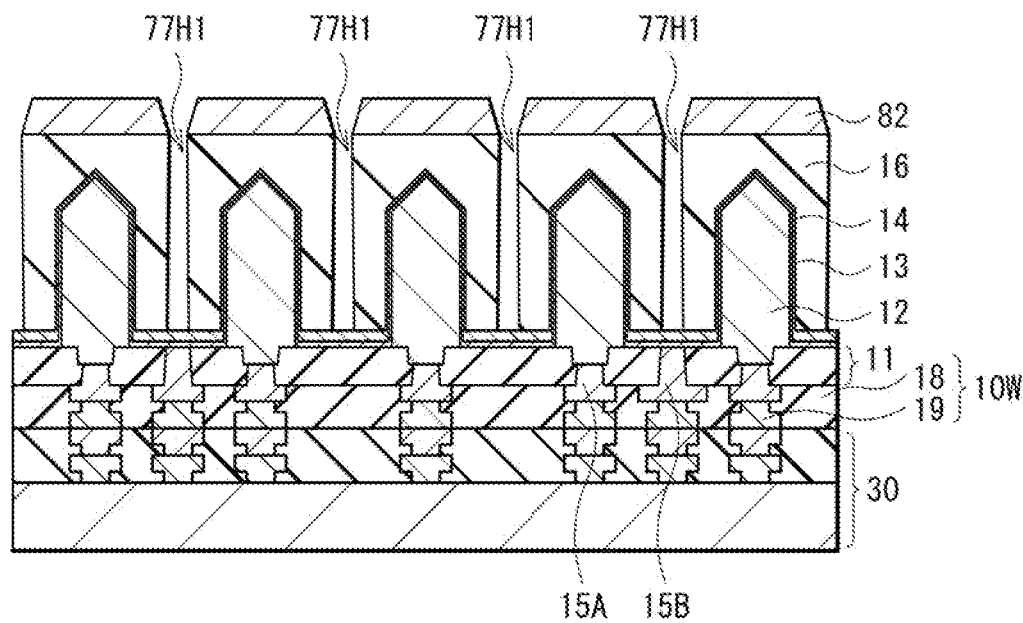
FIG. 11B is a schematic cross-sectional view of a step subsequent to FIG. 11A.
Figure 11C:
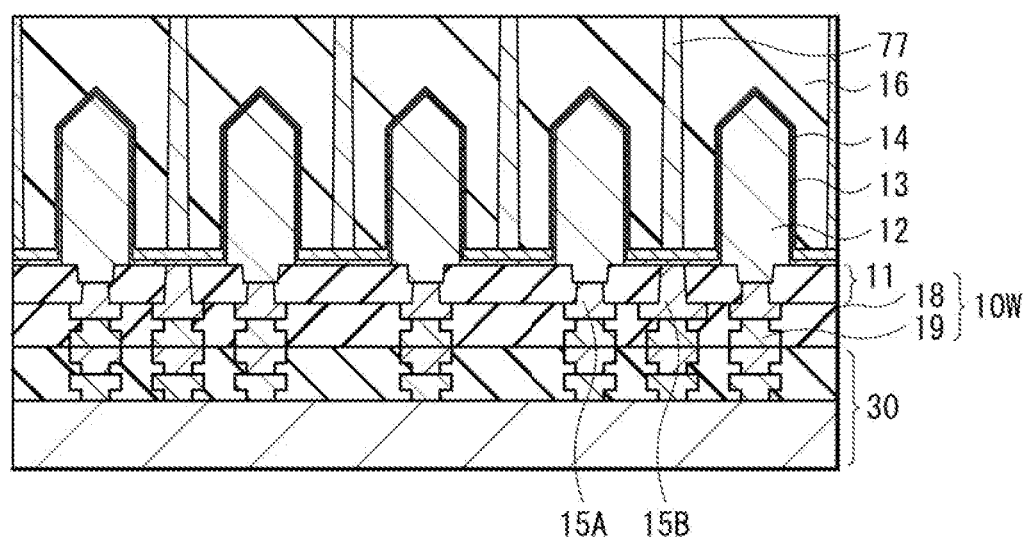
FIG. 11C is a schematic cross-sectional view of a step subsequent to FIG. 11B.

The light-emitting device 2 can be manufactured, for example, as follows. FIGS. 11A to 11C illustrate a method of manufacturing the light-emitting device 2 in the order of steps.

First, a method similar to that of the foregoing first embodiment is used to form the columnar structure 12 and attach the drive substrate 30 thereto with the wiring layer 10W interposed therebetween. Thereafter, as illustrated in FIG. 11A, inversion is performed, and a support substrate (unillustrated) attached onto the insulating film 16 is removed.

Subsequently, as illustrated in FIG. 11B, for example, a chemical vapor deposition method (CVD method) is used to form, for example, a mask layer 82 having an opening at a predetermined position, on the insulating film 16. Thereafter, for example, DET (Double Exposure Technology) is used to penetrate the insulating film 16 and to form an opening 77H1 having a forward tapered shape. Next, as illustrated in FIG. 11C, for example, a CVD method is used to form, for example, Al as a film to fill the opening 77H1, and then, for example, etch-back is used to remove the Al film formed outside the opening 77H1 and the mask layer 82, thus forming the partition wall 77 including Al. Thereafter, the wavelength conversion section 20 is formed on the light output surface 10S1. Through the above-described steps, the light-emitting device 2 illustrated in FIG. 10 is completed.

As described above, the partition wall 77 having a forward tapered shape in which the inclined surface has an angle of less than 90° can also be formed from the side of the light output surface 10S1. In addition, similarly to the foregoing first embodiment, the partition wall 77 is formed after formation of the multiple columnar structures 12, thus enabling fine working, as compared with the case where the formation is performed prior to the multiple columnar structures 12.

6. Modification Example 4

Figure 12:
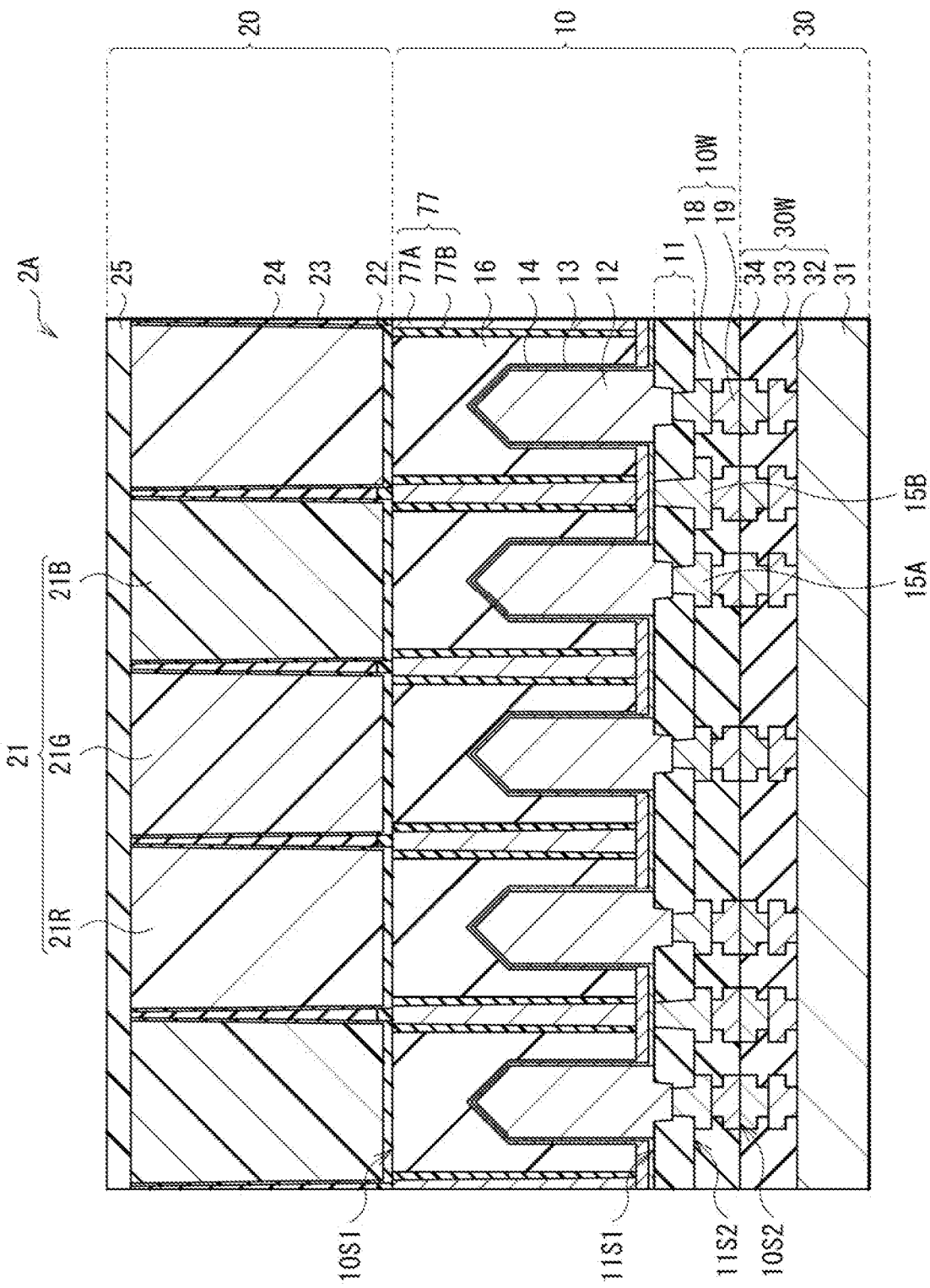
FIG. 12 is a schematic cross-sectional view of an example of a configuration of a light-emitting device according to Modification Example 4 of the present disclosure.

FIG. 12 schematically illustrates an example of a cross-sectional configuration of a light-emitting device (a light-emitting device 2A) according to Modification Example 4 of the present disclosure. The light-emitting device 2A of the present modification example differs from the foregoing second embodiment in that a printing technique is used to form the partition wall 77 from the side of the light output surface 10S1.

The light-emitting device 2A can be produced, for example, as follows. FIGS. 13A to 13F illustrate a method of manufacturing the light-emitting device 2 in the order of steps.

Figure 13A:
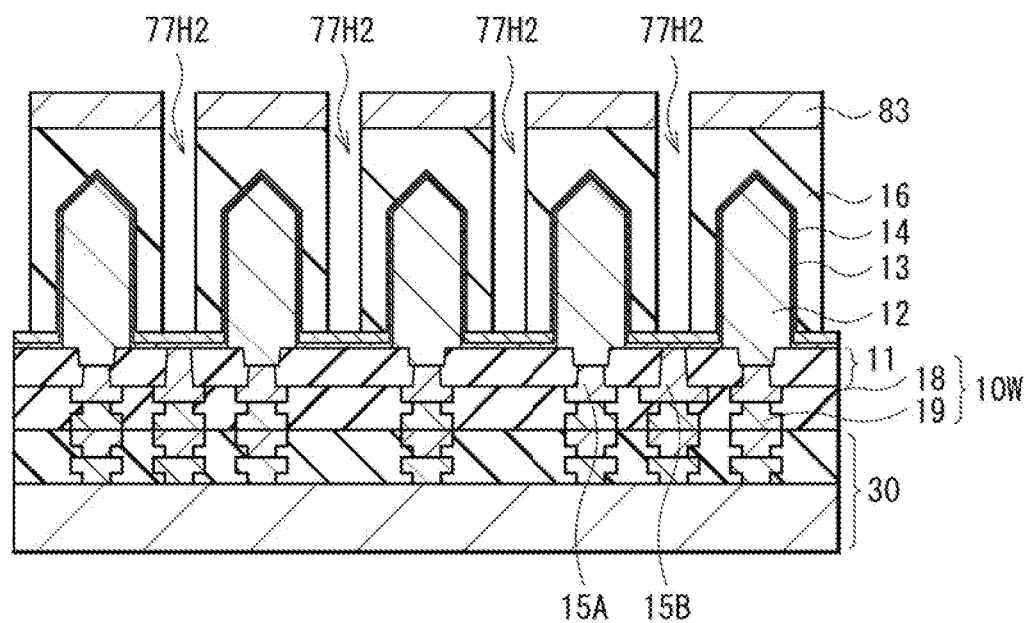
FIG. 13A is an explanatory schematic cross-sectional view of an example of a step of manufacturing the light-emitting device illustrated in FIG. 12.

First, similarly to the foregoing second embodiment, the columnar structure 12 is formed, and the drive substrate 30 is attached thereto with the wiring layer 10W interposed therebetween. Thereafter, inversion is performed, and a support substrate (unillustrated) attached onto the insulating film 16 is removed. Subsequently, as illustrated in FIG. 13A, for example, a lithography technique is used to form, for example, a mask layer 83 having an opening at a predetermined position on the insulating film 16. Thereafter, for example, dry etching is used to form an opening 77H2 penetrating the insulating film 16.

Figure 13B:
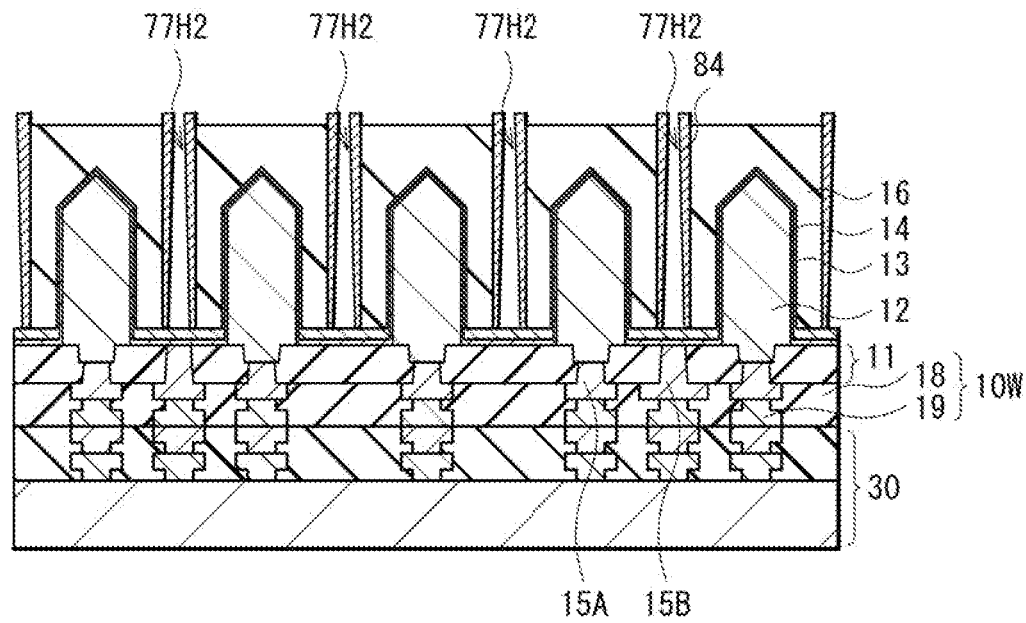
FIG. 13B is a schematic cross-sectional view of a step subsequent to FIG. 13A.
Figure 13C:
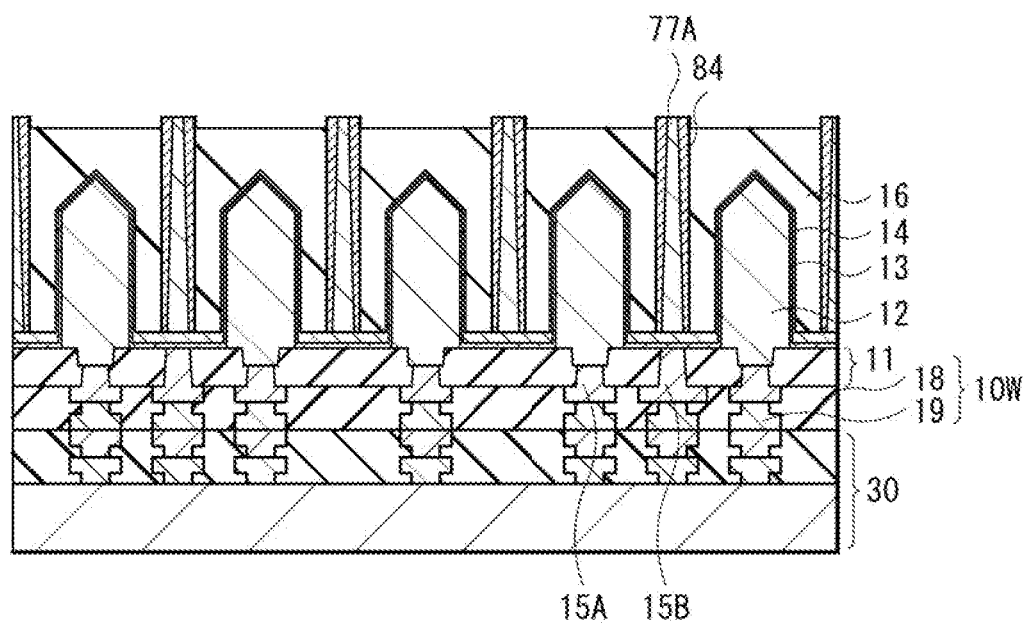
FIG. 13C is a schematic cross-sectional view of a step subsequent to FIG. 13B.

Next, the mask layer 83 is removed by, for example, wet etching. Thereafter, as illustrated in FIG. 13B, for example, a lithography technique is used to form a mask layer 84 on a side surface of the opening 77H2, and the opening 77H2 is allowed to have a forward tapered shape. Subsequently, as illustrated in FIG. 13C, for example, printing is used to form a light-blocking film 77A including, for example, Al inside the opening 77H2. This allows for formation of the light-blocking film 77A having a forward tapered shape inside the opening 77H2.

Figure 13D:
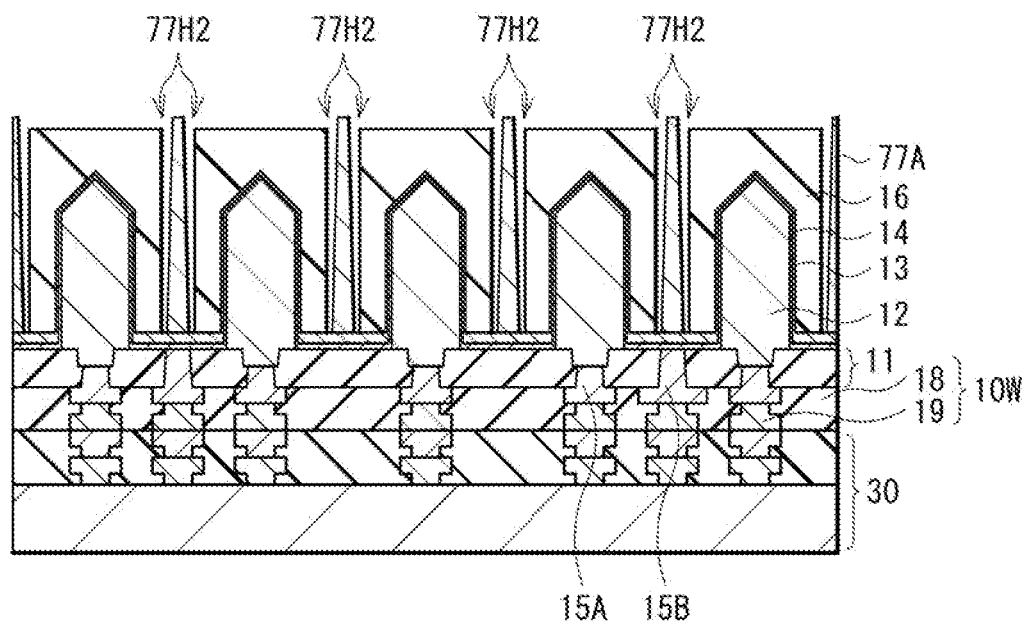
FIG. 13D is a schematic cross-sectional view of a step subsequent to FIG. 13C.
Figure 13E:
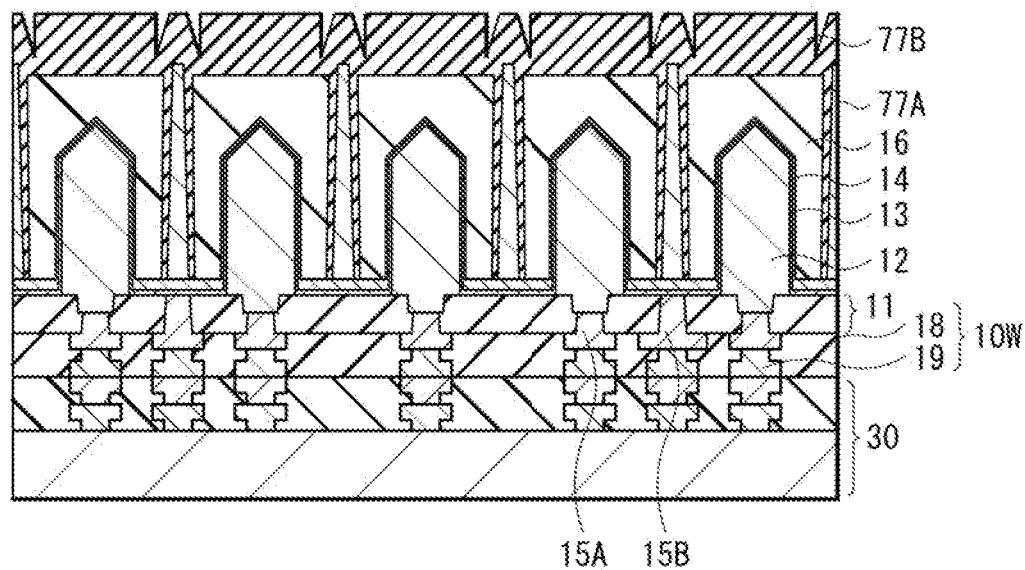
FIG. 13E is a schematic cross-sectional view of a step subsequent to FIG. 13D.
Figure 13F:
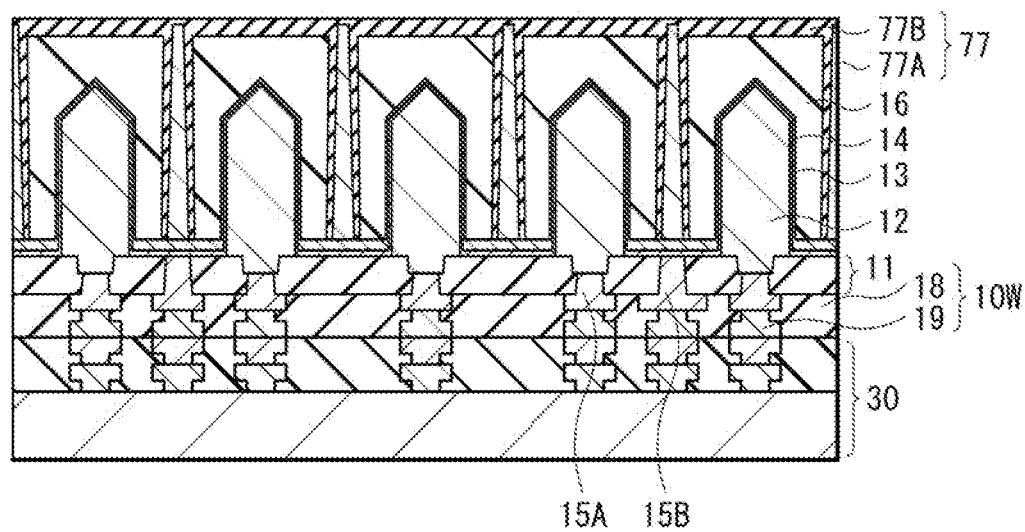
FIG. 13F is a schematic cross-sectional view of a step subsequent to FIG. 13E.

Next, as illustrated in FIG. 13D, for example, wet etching is used to remove the mask layer 84 formed inside the opening 77H. Subsequently, as illustrated in FIG. 13E, for example, a CVD method is used to form an insulating film 77B including, for example, SiO in the opening 77H2, and then, as illustrated in FIG. 13F, for example, a CMP method is used to planarize a surface of the insulating film 77B. Thereafter, the wavelength conversion section 20 is formed on the light output surface 10S1. Through the above-described steps, the light-emitting device 2A illustrated in FIG. 12 is completed.

In this manner, the partition wall 77 having a forward tapered shape in which the inclined surface has an angle of less than 90° can also be formed using a printing technique.

7. Modification Example 5

Figure 14:
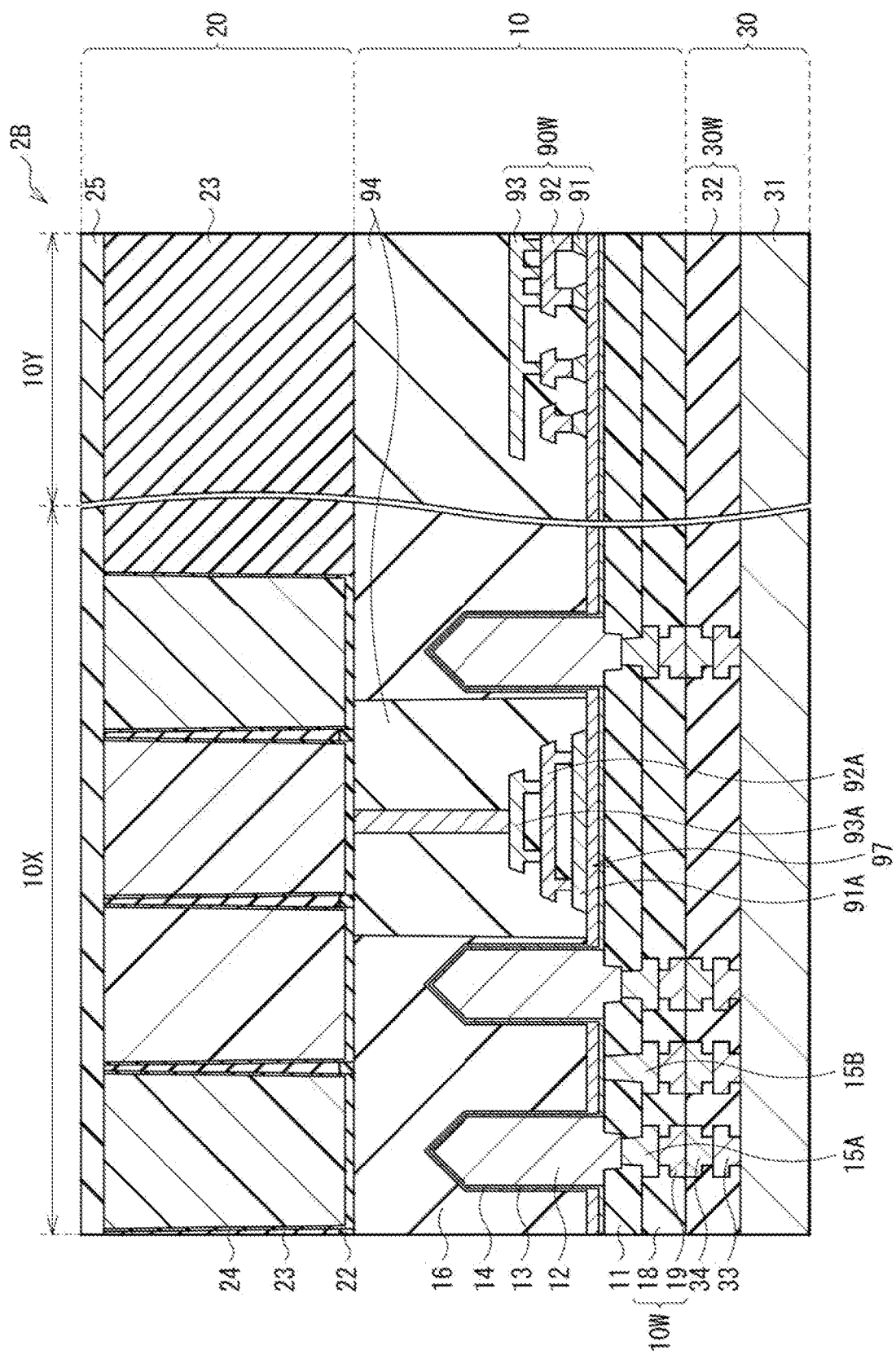
FIG. 14 is a schematic cross-sectional view of an example of a configuration of a light-emitting device according to Modification Example 5 of the present disclosure.

FIG. 14 schematically illustrates an example of a cross-sectional configuration of a light-emitting device (a light-emitting device 2B) according to a Modification Example 5 of the present disclosure. The light-emitting device 2B of the present modification example differs from the foregoing second embodiment in that a partition wall 97 to be provided between adjacent columnar structures 12 is formed using multiple wiring lines formed in a peripheral region 10Y around a light-emitting region 10X provided with the multiple columnar structures 12.

The peripheral region 10Y is provided with, for example, a wiring layer 90W in which multiple wiring lines 91, 92, and 93 are stacked and formed, and the multiple wiring lines 91, 92, and 93 constitute, for example, a logic circuit, or the like.

Figure 15A:
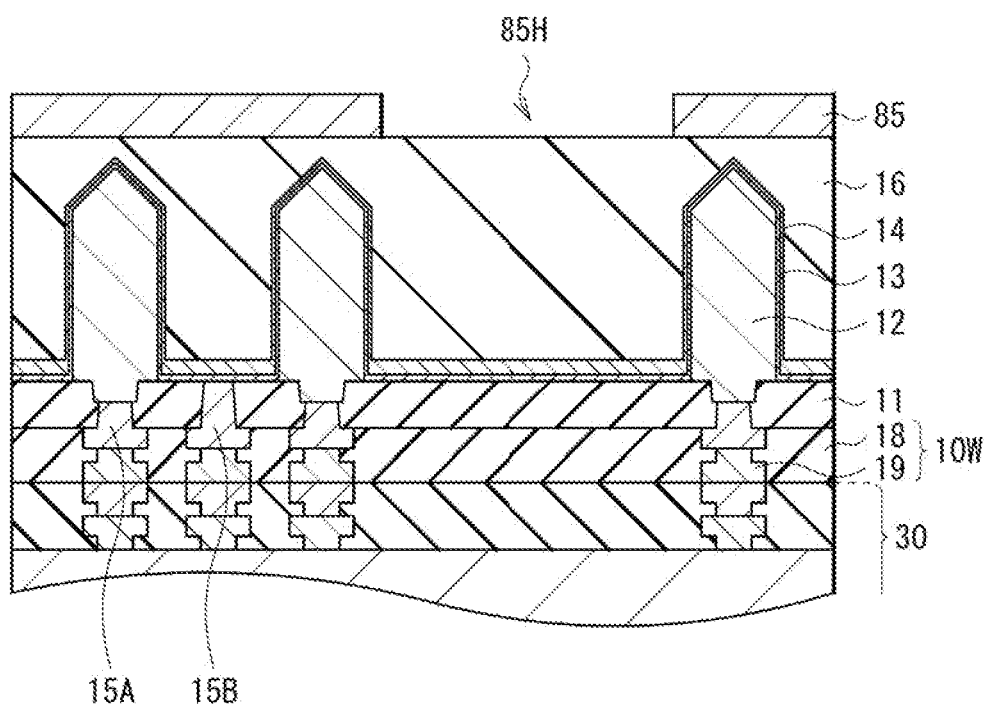
FIG. 15A is an explanatory schematic cross-sectional view of an example of a step of manufacturing the light-emitting device illustrated in FIG. 14.
Figure 15B:
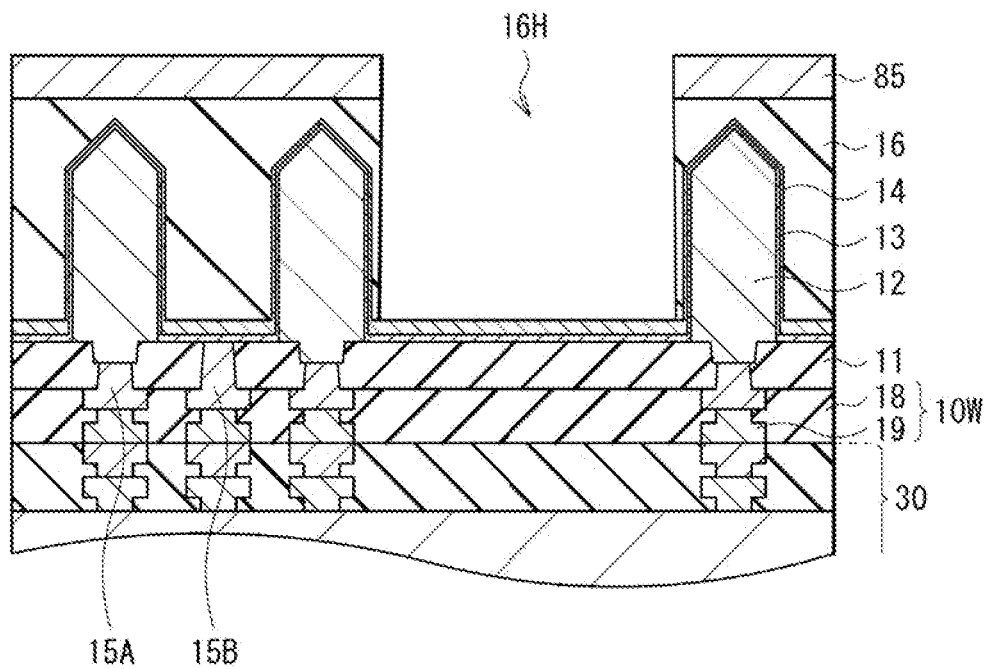
FIG. 15B is a schematic cross-sectional view of a step subsequent to FIG. 15A.

The light-emitting device 2B can be produced, for example, as follows. FIGS. 15A to 15N illustrate a method of manufacturing the light-emitting device 2 in the order of steps.

First, as illustrated in FIG. 15A, similarly to the foregoing Modification Example 4, for example, a lithography technique is used to form, for example, a mask layer 85 having an opening 85H at a predetermined position on the insulating film 16. Subsequently, as illustrated in FIG. 15B, dry etching is used to form an opening 16H penetrating the insulating film 16.

Figure 15C:
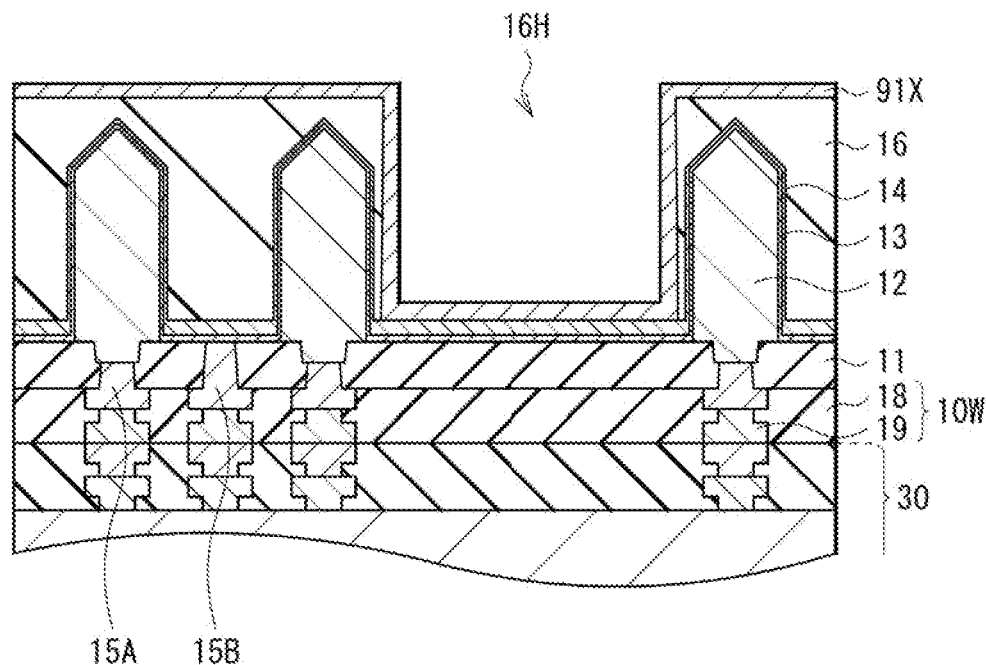
FIG. 15C is a schematic cross-sectional view of a step subsequent to FIG. 15B.
Figure 15D:
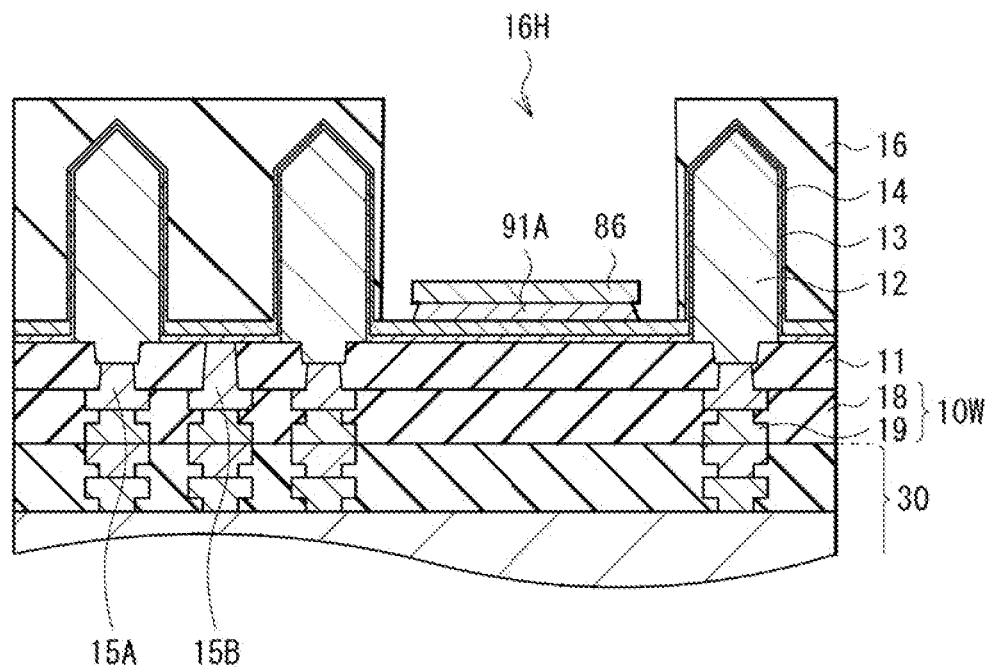
FIG. 15D is a schematic cross-sectional view of a step subsequent to FIG. 15C.

Next, the mask layer 85 is removed, and then, as illustrated in FIG. 15C, for example, a sputtering method is used to form an electrically-conductive film 91X including, for example, Al, which is continuous on the insulating film 16 and on a side surface and a bottom surface of the opening 16H. Subsequently, as illustrated in FIG. 15D, for example, a lithography technique is used to form a mask layer 86 inside the opening 16H, and then wet etching is performed. This allows for formation of a light-blocking film 91A having an inclined surface on a side surface thereof, which is the first layer of the partition wall 97, inside the opening 16H.

Figure 15E:
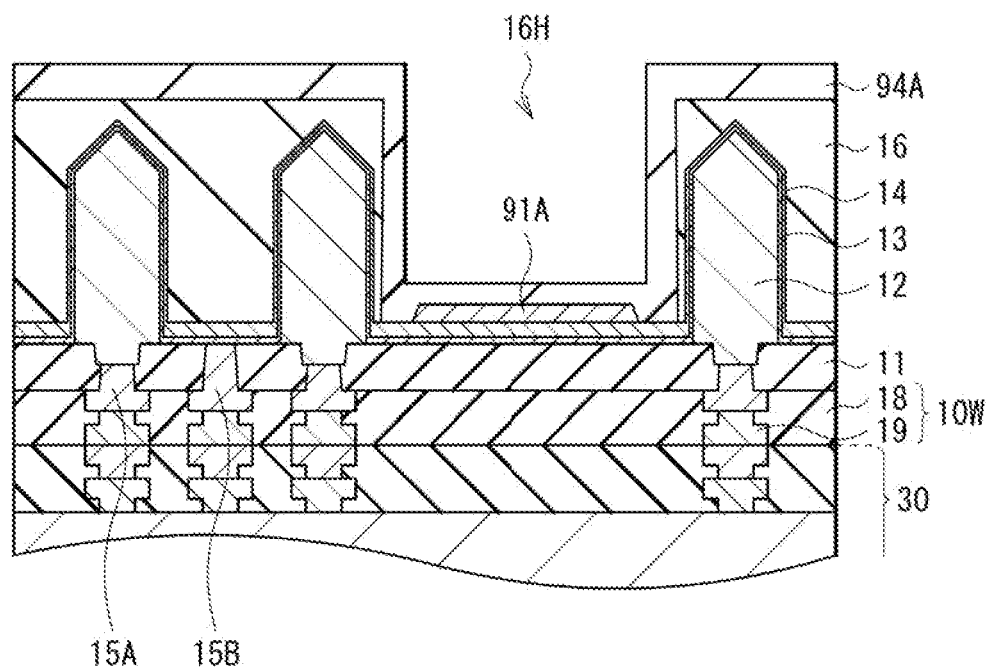
FIG. 15E is a schematic cross-sectional view of a step subsequent to FIG. 15D.
Figure 15F:
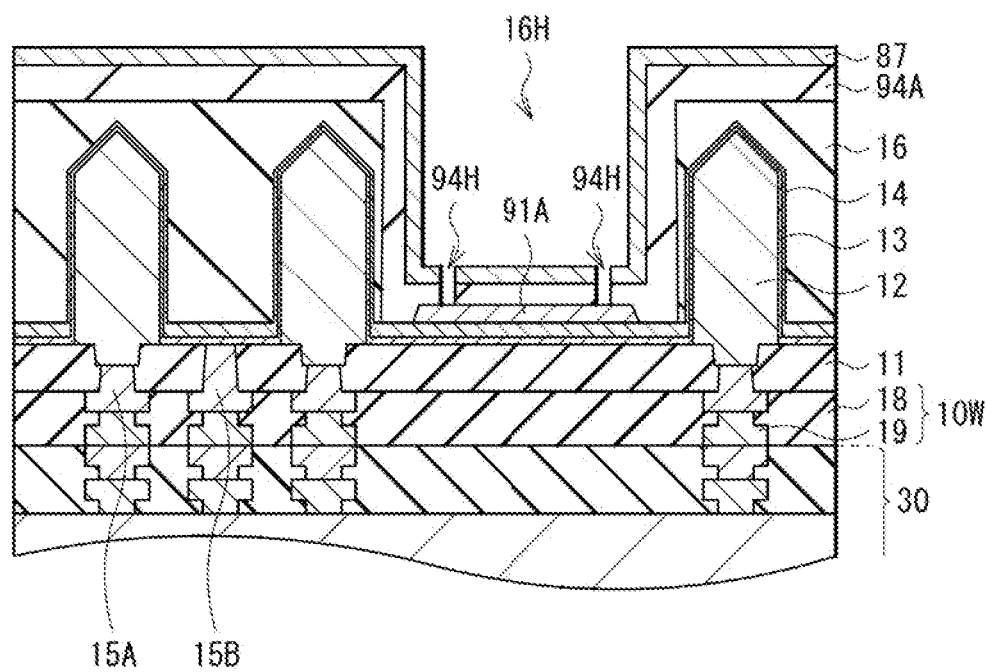
FIG. 15F is a schematic cross-sectional view of a step subsequent to FIG. 15E.
Figure 15G:
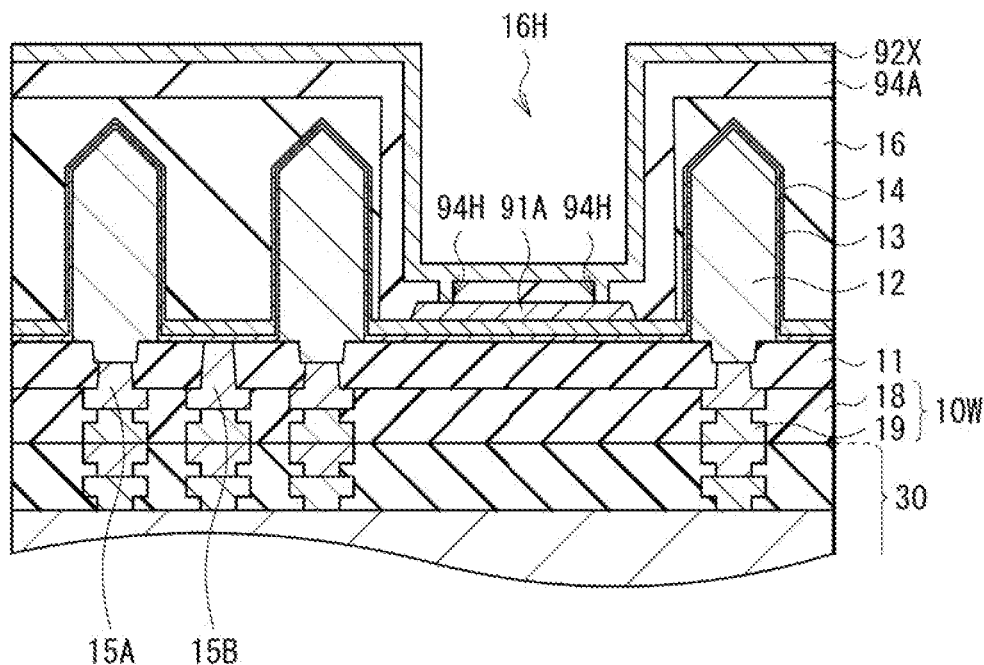
FIG. 15G is a schematic cross-sectional view of a step subsequent to FIG. 15F.

Next, as illustrated in FIG. 15E, for example, a CVD method is used to form an insulating film 94A on the insulating film 16 and on the side surface and the bottom surface of the opening 16H. Subsequently, as illustrated in FIG. 15F, for example, a lithography technique is used to form, on the insulating film 94A, a mask layer 87 having an opening at a predetermined position inside the opening 16H. Thereafter, dry etching is used to form an opening 94H penetrating to the light-blocking film 91A. Next, the mask layer 87 is removed, and then, as illustrated in FIG. 15G, an electrically-conductive film 92X including, for example, Al is formed to fill the opening 94H.

Figure 15H:
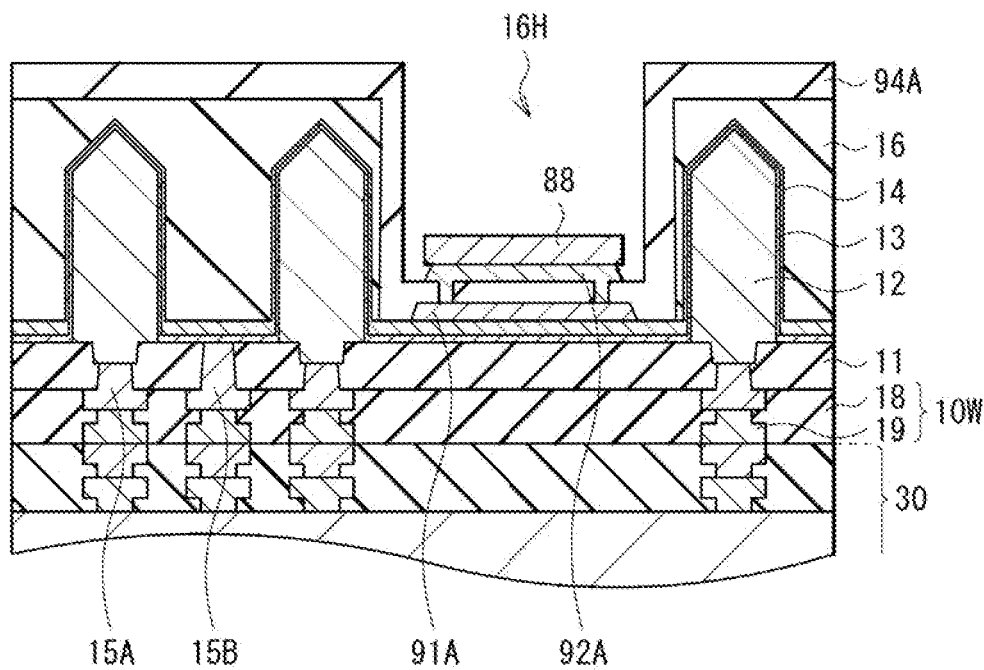
FIG. 15H is a schematic cross-sectional view of a step subsequent to FIG. 15G.
Figure 15I:
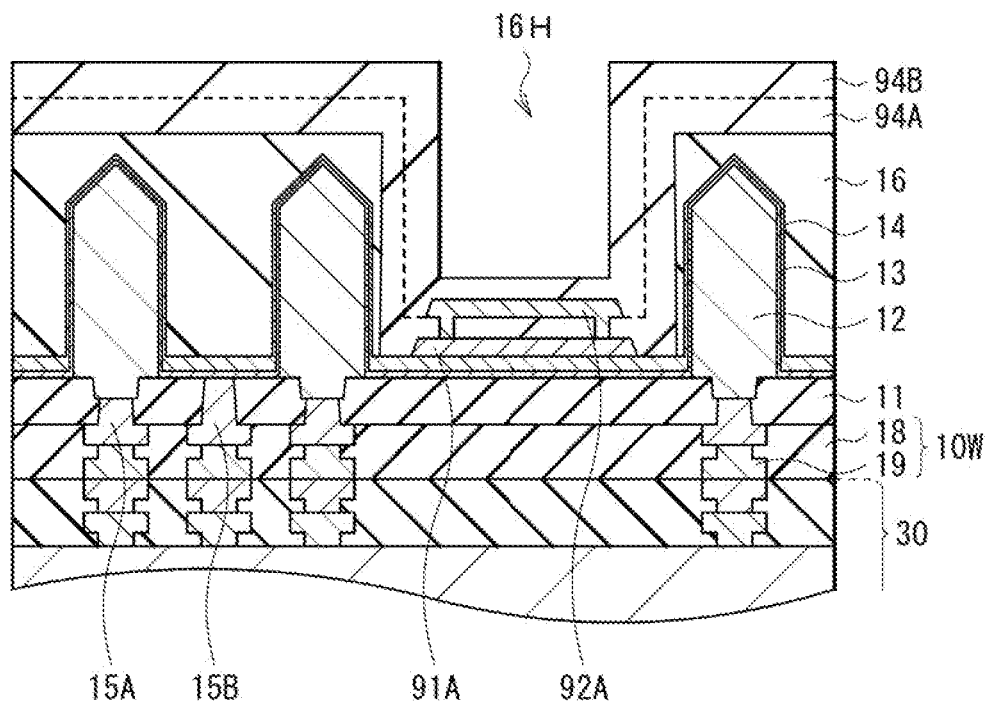
FIG. 15I is a schematic cross-sectional view of a step subsequent to FIG. 15H.
Figure 15J:
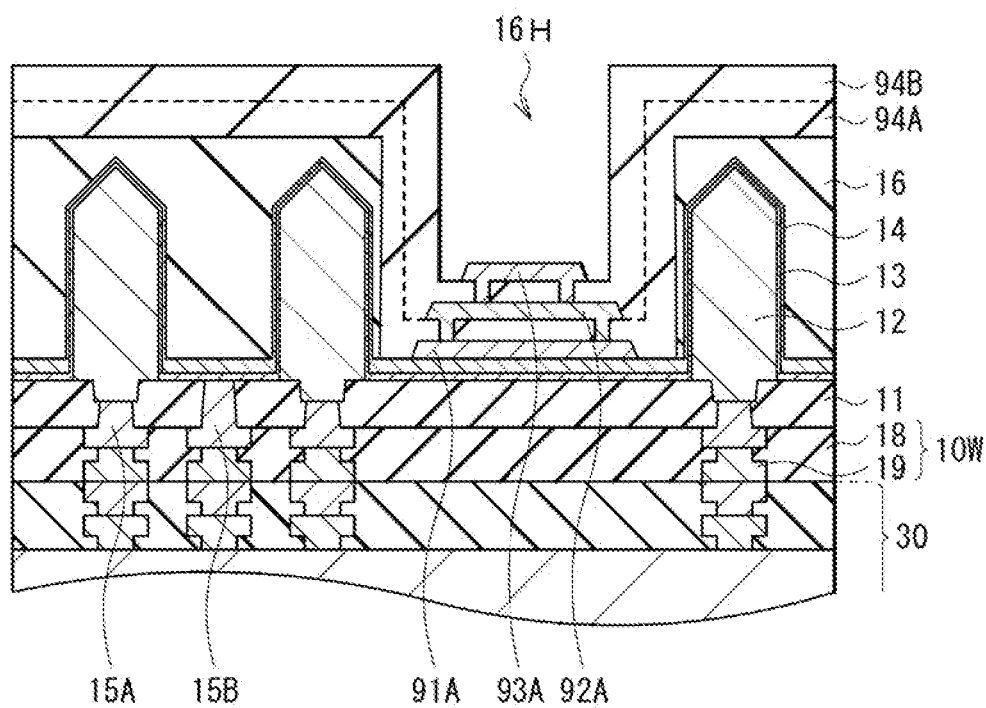
FIG. 15J is a schematic cross-sectional view of a step subsequent to FIG. 15I.

Subsequently, as illustrated in FIG. 15H, for example, a lithography technique is used to form a mask layer 88 inside the opening 16H, and then wet etching is performed. This allows for formation of a light-blocking film 92A having an inclined surface on a side surface thereof, which is the second layer of the partition wall 97, inside the opening 16H. Next, as illustrated in FIG. 15I, for example, a CVD method is used to form an insulating film 94B on the insulating film 94A. Subsequently, as illustrated in FIG. 15J, a similar method is used to form a light-blocking film 93A which is the third layer of the partition wall 97, inside the opening 16H.

Figure 15K:
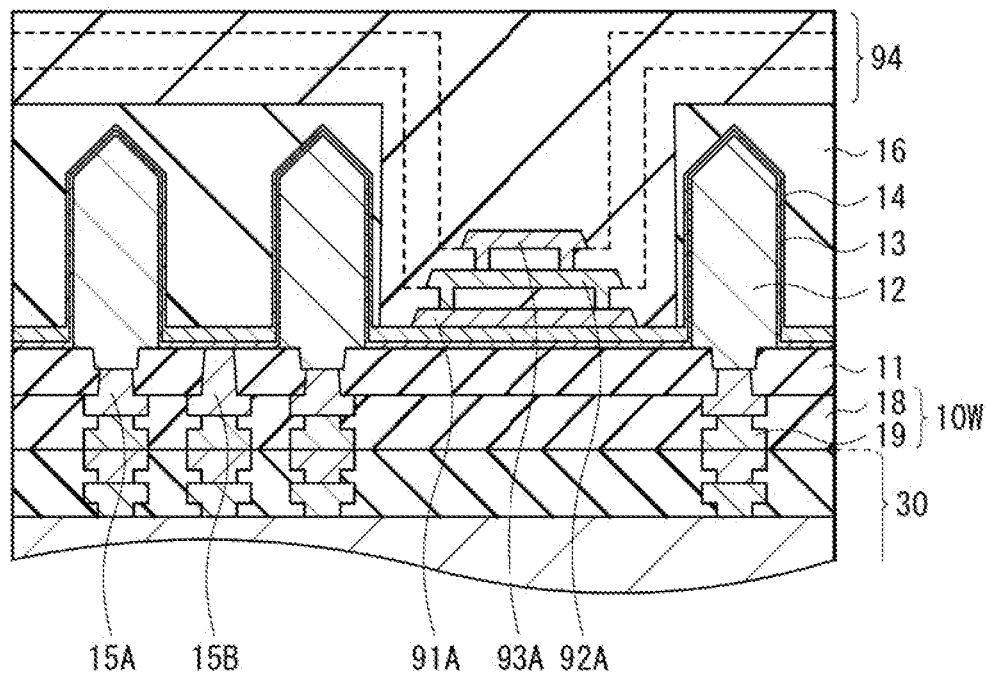
FIG. 15K is a schematic cross-sectional view of a step subsequent to FIG. 15J.
Figure 15L:
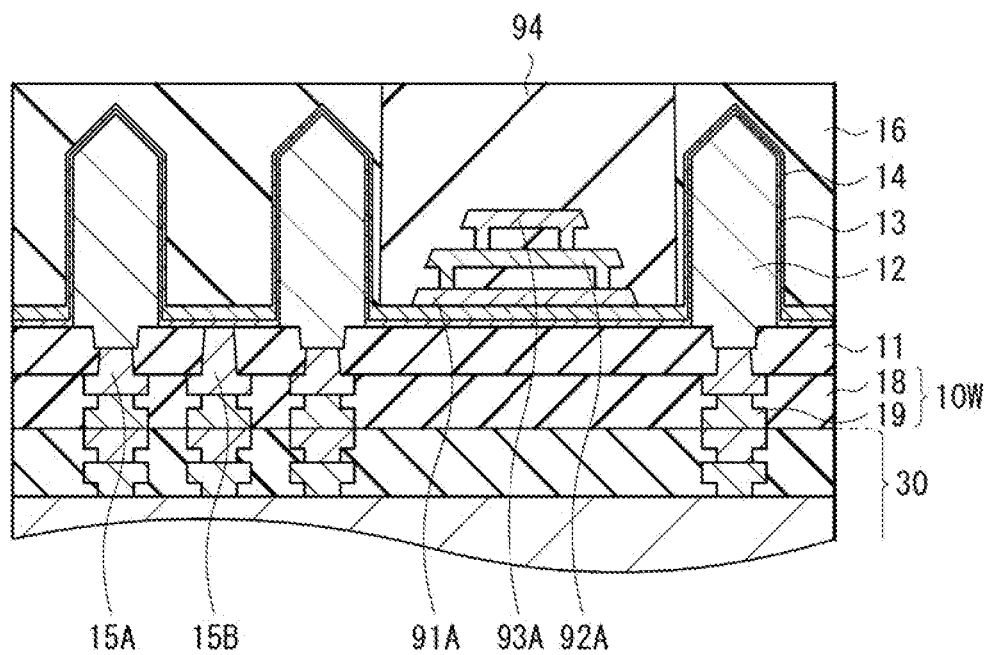
FIG. 15L is a schematic cross-sectional view of a step subsequent to FIG. 15K.
Figure 15M:
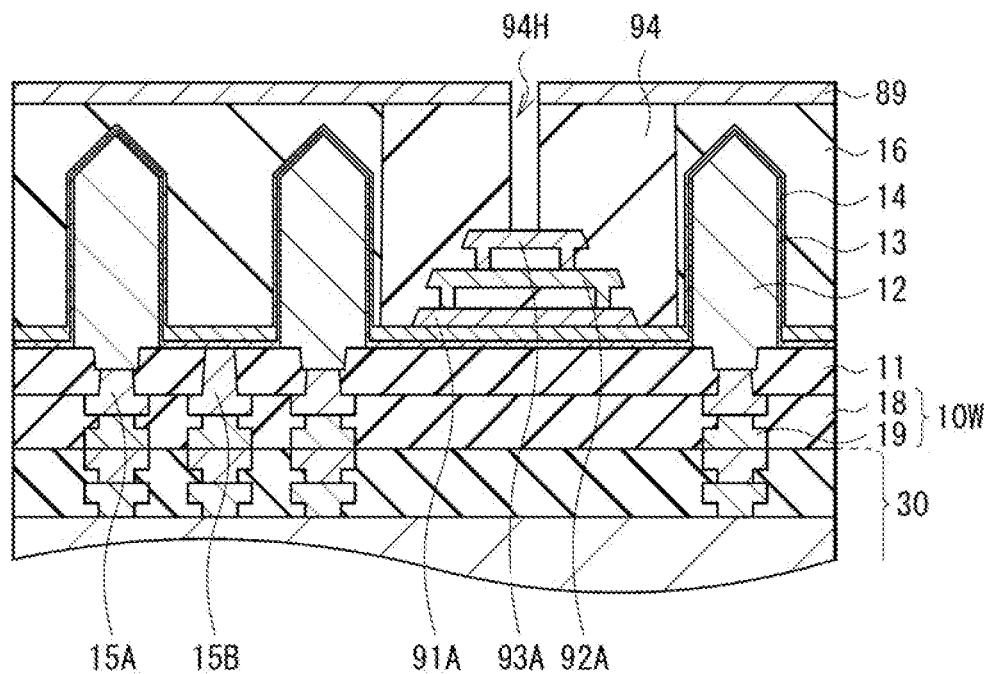
FIG. 15M is a schematic cross-sectional view of a step subsequent to FIG. 15L.
Figure 15N:
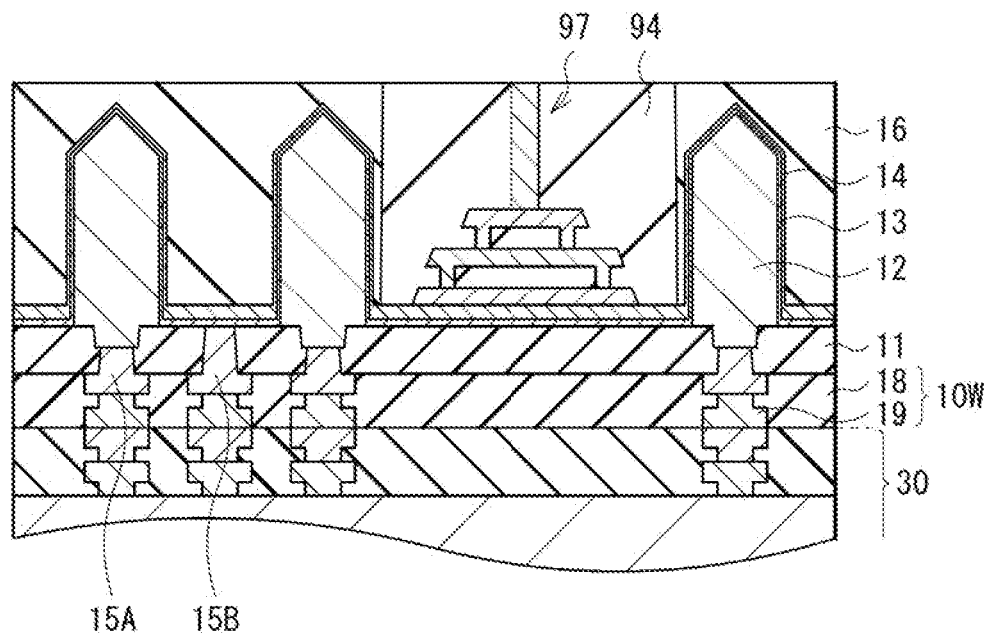
FIG. 15N is a schematic cross-sectional view of a step subsequent to FIG. 15M.

Next, as illustrated in FIG. 15K, for example, a CVD method is used to form an insulating film 94 to fill the opening 16H. Subsequently, as illustrated in FIG. 15L, for example, a CMP method is used to remove the insulating film 94 provided on the insulating film 16. Next, as illustrated in FIG. 15M, a mask layer 89 having an opening at a predetermined position is formed, and then, for example, dry etching is used to form the opening 94H penetrating the insulating film 94 to the light-blocking film 93A.

Subsequently, for example, wet etching is used to remove the mask layer 89, and then, as illustrated in FIG. 15N, for example, a sputtering method and etch-back are used to form a metal film including, for example, Al, inside the opening 94H. This allows for formation of the partition wall 97. Thereafter, the wavelength conversion section 20 is formed on the light output surface 10S1. Through the above-described steps, the light-emitting device 2B illustrated in FIG. 14 is completed.

As described above, the partition wall 97 provided between adjacent columnar structures 12 may be formed using the multiple wiring lines 91, 92, and 93 formed in the peripheral region 10Y and constituting a logic circuit, for example. By forming the partition wall 97 using a multilayer wiring layer (e.g., wiring lines 91, 92, and 93) formed in the peripheral region 10Y, it is possible to form the partition wall 97 simultaneously in a formation step of the logic circuit. Thus, it is possible to reduce manufacturing steps as compared with the case of separately forming (e.g., the partition wall 77) as in the foregoing second embodiment, etc.

8. Modification Example 6

Figure 16:
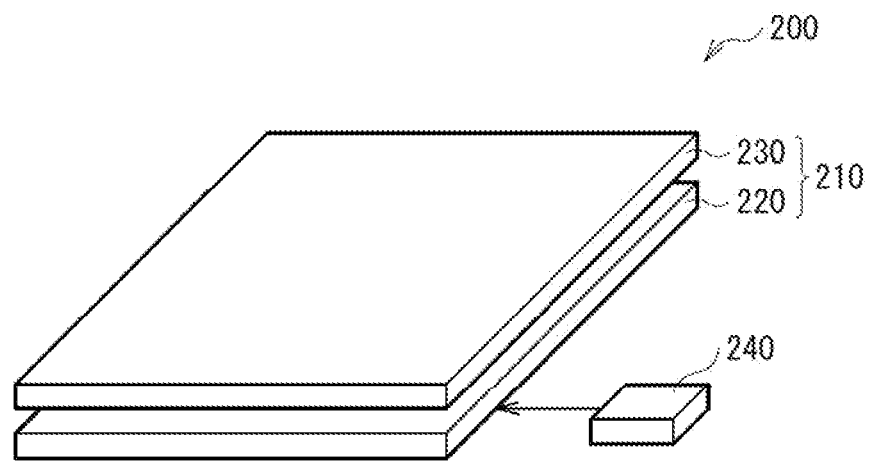
FIG. 16 is a perspective view of another example of the configuration of the display apparatus including the light-emitting device of the present disclosure.

FIG. 16 is a perspective view of another configuration example (an image display apparatus 200) of the display apparatus using the light-emitting device (e.g., light-emitting device 1) of the present disclosure. The image display apparatus 200 is called a so-called tiling display in which an LED is used as a light source, and the light-emitting device 1 of the present embodiment is used as a display pixel. For example, as illustrated in FIG. 16, the image display apparatus 200 includes a display panel 210 and a control circuit 240 that drives the display panel 210.

The display panel 210 includes a mounting substrate 220 and a counter substrate 230 which are overlapped each other. The counter substrate 230 has a surface serving as a picture display surface, and has a display region at a middle portion thereof as well as a frame region being a non-display region around the display region (none of which is illustrated). For example, the counter substrate 230 is disposed at a position facing the mounting substrate 220 with a predetermined gap interposed therebetween. It is to be noted that the counter substrate 230 may be in contact with a top surface of the mounting substrate 220.

Figure 17:
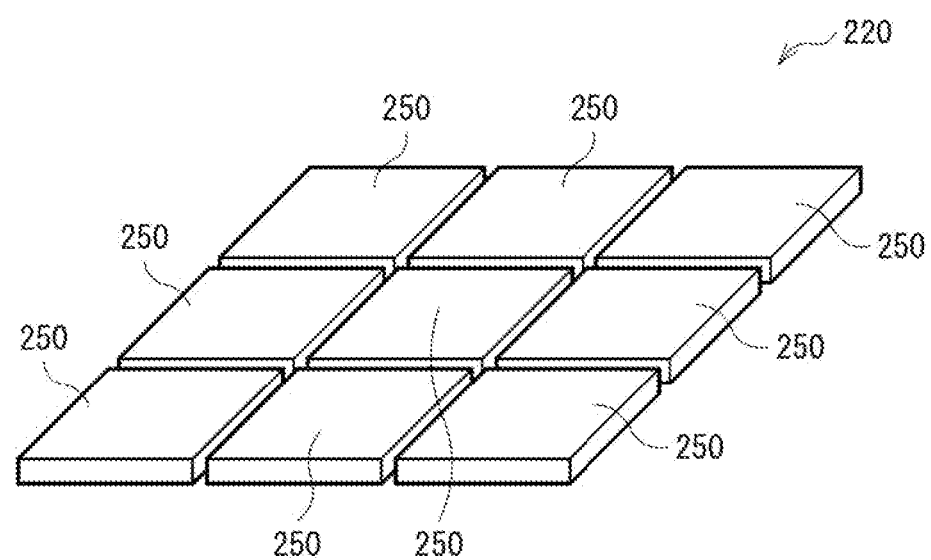
FIG. 17 is a perspective view of a configuration of a mounting substrate illustrated in FIG. 16.

FIG. 17 schematically illustrates an example of a configuration of the mounting substrate 220. For example, as illustrated in FIG. 17, the mounting substrate 220 is configured by multiple unit substrates 250 laid in a tile shape. It is to be noted that FIG. 17 illustrates the example in which the mounting substrate 220 is configured by nine unit substrates 250; however, the number of the unit substrates 250 may be ten or more, or may be eight or less.

Figure 18:
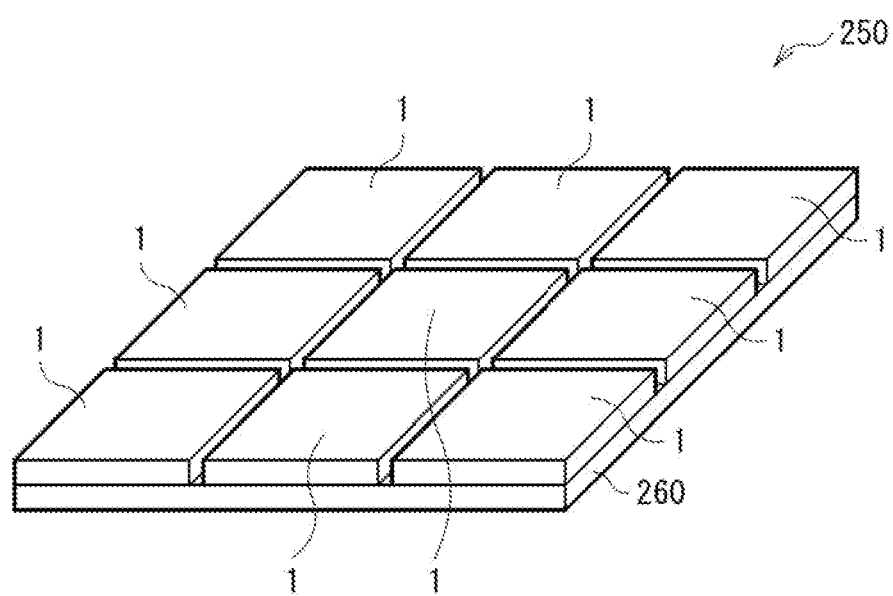
FIG. 18 is a perspective view of a configuration of a unit substrate illustrated in FIG. 17.

FIG. 18 illustrates an example of a configuration of the unit substrate 250. The unit substrate 250 includes, for example, the light-emitting devices 1 including multiple light-emitting sections (e.g., light-emitting sections A1, A2, A3, A4, A5, and A6) laid in a tile shape, and a support substrate 260 that supports the respective light-emitting devices 1. Each of the unit substrates 250 further includes a control substrate (unillustrated). The support substrate 260 is configured by, for example, a metal frame (metal plate), a wiring substrate, or the like. In a case where the support substrate 260 is configured by a wiring substrate, it may also be possible for the support substrate 260 to serve as a control substrate. At this time, at least one of the support substrate 260 or the control substrate is electrically coupled to each of the light-emitting devices 1.

Description has been given hereinabove of the present disclosure referring to the first and second embodiments and Modification Example 1 to 6; however, the present disclosure is not limited to the foregoing embodiments, and may be modified in a wide variety of ways. For example, the components, the arrangement, the number, and the like of the light-emitting element (columnar structure 12) exemplified in the foregoing embodiments, and the like are merely exemplary. All of the components need not be included, and other components may further be included.

In addition, the foregoing embodiments and the like have given the examples in which the light-emitting device 1 or the like is applied to the image display apparatus 100, 200, or the like; however, the light-emitting device 1 or the like of the present disclosure can also be used as an illumination apparatus.

It is to be noted that the effects described herein are merely exemplary and are not limited thereto, and may further include other effects.

The present technology may also have the following configurations. According to the present technology of the following configurations, there is provided, between multiple columnar structures erected on a first surface of an insulating layer having the first surface and a second surface opposed to each other, a light-blocking member having an inclined surface of less than 90° relative to the first surface. This makes it possible to reduce optical leakage to adjacent columnar structures. Thus, it is possible to suppress occurrence of color mixture.

(1)
A light-emitting device including:
an insulating layer having a first surface and a second surface that are opposed to each other;
multiple columnar structures each including a columnar crystalline structure of a first electrically-conductive type erected in a direction perpendicular to the first surface of the insulating layer, and an active layer and a semiconductor layer of a second electrically-conductive type that are stacked in this order on a side surface and a top surface of the columnar crystalline structure; and
a light-blocking member provided between the multiple columnar structures and having an inclined surface of less than 90° relative to the first surface.

(2)
The light-emitting device according to (1), in which the light-blocking member has light reflectivity.

(3)
The light-emitting device according to (1) or (2), in which the light-blocking member has a forward tapered shape.
(4)
The light-emitting device according to any one of (1) to (3), in which the light-blocking member includes multiple wiring layers.
(5)
The light-emitting device according to any one of (1) to (4), further including:
a first electrode to be in contact with the columnar crystalline structure of each of the multiple columnar structures from the second surface of the insulating layer; and a second electrode that continuously covers a side surface and a top surface of the semiconductor layer of each of the multiple columnar structures on a side of the first surface of the insulating layer.
(6)
The light-emitting device according to (5), further including a drive substrate provided on a side of the second surface of the insulating layer and being electrically coupled to the columnar structures and the semiconductor layer via the first electrode and the second electrode.
(7)
The light-emitting device according to (6), in which the light-blocking member penetrates the second electrode and the insulating layer.
(8)
The light-emitting device according to any one of (1) to (7), in which the light-blocking member includes an electrically-conductive material.
(9)
The light-emitting device according to any one of (6) to (8), further including a wiring layer including multiple first contact electrodes each exposed to a surface facing the drive substrate on the side of the second surface of the insulating layer, in which
the first electrode, the second electrode, and the light-blocking member are electrically coupled to each of the multiple first contact electrodes.
(10)
The light-emitting device according to (9), in which
the drive substrate further includes multiple second contact electrodes each exposed to a surface facing the insulating layer, and
the insulating layer and the drive substrate are bonded to each other via the first contact electrodes and the second contact electrodes.
(11)
The light-emitting device according to any one of (1) to (10), in which
the multiple columnar structures are provided in matrix on the first surface of the insulating layer, and
the light-blocking member is provided in a grid pattern on the first surface of the insulating layer.
(12)
The light-emitting device according to any one of (1) to (11), further including an insulating film provided on the first surface of the insulating layer and covering a side surface and a top surface of each of the multiple columnar structures, in which
the light-blocking member is provided to penetrate the insulating film.
(13)
The light-emitting device according to any one of (1) to (12), further including, above the columnar structures, a wavelength conversion section that converts a wavelength of light emitted from the active layer.
(14)
The light-emitting device according to (13), in which the wavelength conversion section includes multiple wavelength conversion layers that each convert light emitted from the active layer of each of the multiple columnar structures into a wavelength different from one another.
(15)
A display apparatus including one or multiple light-emitting devices,
the light-emitting devices each including
an insulating layer having a first surface and a second surface that are opposed to each other,
multiple columnar structures each including a columnar crystalline structure of a first electrically-conductive type erected in a direction perpendicular to the first surface of the insulating layer, and an active layer and a semiconductor layer of a second electrically-conductive type that are stacked in this order on a side surface and a top surface of the columnar crystalline structure, and
a light-blocking member provided between the multiple columnar structures and having an inclined surface of less than 90° relative to the first surface.

This application claims the benefit of Japanese Priority Patent Application JP 2020-123308 filed with the Japan Patent Office on Jul. 17, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A light-emitting device, comprising:
an insulating layer having a first surface and a second surface that are opposed to each other;
multiple columnar structures each including a columnar crystalline structure of a first electrically-conductive type erected in a direction perpendicular to the first surface of the insulating layer, and an active layer and a semiconductor layer of a second electrically-conductive type that are stacked in this order on a side surface and a top surface of the columnar crystalline structure;
a light-blocking member provided between the multiple columnar structures and having an inclined surface of greater than 90° relative to the first surface;
a first electrode to be in contact with the columnar crystalline structure of each of the multiple columnar structures from the second surface of the insulating layer; and
a second electrode that continuously covers a side surface and a top surface of the semiconductor layer of each of the multiple columnar structures on a side of the first surface of the insulating layer.

2. The light-emitting device according to claim 1, wherein the light-blocking member has light reflectivity.

3. The light-emitting device according to claim 1, wherein the light-blocking member has a forward tapered shape.

4. The light-emitting device according to claim 1, wherein the light-blocking member includes multiple wiring layers.

5. The light-emitting device according to claim 1, further comprising a drive substrate provided on a side of the second surface of the insulating layer and being electrically coupled to the columnar structures and the semiconductor layer via the first electrode and the second electrode.

6. The light-emitting device according to claim 5, wherein the light-blocking member penetrates the second electrode and the insulating layer.

7. The light-emitting device according to claim 1, wherein the light-blocking member includes an electrically-conductive material.

8. The light-emitting device according to claim 5, further comprising a wiring layer including multiple first contact electrodes each exposed to a surface facing the drive substrate on the side of the second surface of the insulating layer,
wherein the first electrode, the second electrode, and the light-blocking member are electrically coupled to each of the multiple first contact electrodes.

9. The light-emitting device according to claim 8, wherein the drive substrate further includes multiple second contact electrodes each exposed to a surface facing the insulating layer, and
the insulating layer and the drive substrate are bonded to each other via the first contact electrodes and the second contact electrodes.

10. The light-emitting device according to claim 1, wherein
the multiple columnar structures are provided in matrix on the first surface of the insulating layer, and
the light-blocking member is provided in a grid pattern on the first surface of the insulating layer.

11. The light-emitting device according to claim 1, further comprising an insulating film provided on the first surface of the insulating layer and covering a side surface and a top surface of each of the multiple columnar structures,
wherein the light-blocking member is provided to penetrate the insulating film.

12. The light-emitting device according to claim 1, further comprising, above the columnar structures, a wavelength conversion section that converts a wavelength of light emitted from the active layer.

13. The light-emitting device according to claim 12, wherein the wavelength conversion section includes multiple wavelength conversion layers that each convert light emitted from the active layer of each of the multiple columnar structures into a wavelength different from one another.

14. A display apparatus, comprising:
one or more light-emitting devices,
each of the one or more light-emitting devices including:
an insulating layer having a first surface and a second surface that are opposed to each other;
multiple columnar structures each including a columnar crystalline structure of a first electrically-conductive type erected in a direction perpendicular to the first surface of the insulating layer, and an active layer and a semiconductor layer of a second electrically-conductive type that are stacked in this order on a side surface and a top surface of the columnar crystalline structure,
a light-blocking member provided between the multiple columnar structures and having an inclined surface of greater than 90° relative to the first surface;
a first electrode to be in contact with the columnar crystalline structure of each of the multiple columnar structures from the second surface of the insulating layer; and
a second electrode that continuously covers a side surface and a top surface of the semiconductor layer of each of the multiple columnar structures on a side of the first surface of the insulating layer.

15. The display apparatus according to claim 14, further comprising a drive substrate provided on a side of the second surface of the insulating layer and being electrically coupled to the columnar structures and the semiconductor layer via the first electrode and the second electrode.

16. The display apparatus according to claim 15, wherein the light-blocking member penetrates the second electrode and the insulating layer.

17. The display apparatus according to claim 14, wherein the light-blocking member includes an electrically-conductive material.

18. The display apparatus according to claim 15, further comprising a wiring layer including multiple first contact electrodes each exposed to a surface facing the drive substrate on the side of the second surface of the insulating layer,
wherein the first electrode, the second electrode, and the light-blocking member are electrically coupled to each of the multiple first contact electrodes.

19. The display apparatus according to claim 18, wherein the drive substrate further includes multiple second contact electrodes each exposed to a surface facing the insulating layer, and
the insulating layer and the drive substrate are bonded to each other via the first contact electrodes and the second contact electrodes.

20. The display apparatus according to claim 14, further comprising an insulating film provided on the first surface of the insulating layer and covering a side surface and a top surface of each of the multiple columnar structures,
wherein the light-blocking member is provided to penetrate the insulating film.

* * * * *